(12) United States Patent
Murakami et al.

(10) Patent No.: US 8,174,479 B2
(45) Date of Patent: May 8, 2012

(54) SHIFT REGISTER, CIRCUIT DRIVING DISPLAY DEVICE, AND DISPLAY DEVICE

(75) Inventors: Yuhichiroh Murakami, Mie (JP); Seijirou Gyouten, Mie (JP); Noboru Matsuda, Kyoto (JP); Hajime Washio, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 886 days.

(21) Appl. No.: 11/921,116

(22) PCT Filed: Jun. 12, 2006

(86) PCT No.: PCT/JP2006/311777
§ 371 (c)(1),
(2), (4) Date: Nov. 27, 2007

(87) PCT Pub. No.: WO2006/134885
PCT Pub. Date: Dec. 21, 2006

(65) Prior Publication Data
US 2009/0115716 A1 May 7, 2009

(30) Foreign Application Priority Data
Jun. 14, 2005 (JP) .................................. 2005-174388

(51) Int. Cl.
*G09G 3/36* (2006.01)
(52) U.S. Cl. .......................................... 345/100; 377/64
(58) Field of Classification Search .................. 345/100; 377/64
See application file for complete search history.

(56) References Cited

U.S. PATENT DOCUMENTS

| | | | |
|---|---|---|---|
| 5,625,376 A | 4/1997 | Maekawa | |
| 6,791,539 B2 * | 9/2004 | Nakajima et al. | 345/204 |
| 2001/0005196 A1 * | 6/2001 | Ishii | 345/100 |
| 2003/0179174 A1 | 9/2003 | Matsuda et al. | |
| 2004/0183771 A1 * | 9/2004 | Satoh et al. | 345/100 |
| 2005/0225526 A1 * | 10/2005 | Chiu et al. | 345/98 |

FOREIGN PATENT DOCUMENTS

| | | |
|---|---|---|
| JP | 7-20816 | 1/1995 |
| JP | 11-133934 | 5/1999 |
| JP | 2000-181414 | 6/2000 |
| JP | 2001-249636 | 9/2001 |
| JP | 2004-5904 | 1/2004 |

* cited by examiner

*Primary Examiner* — Richard Hjerpe
*Assistant Examiner* — Sahlu Okebato
(74) *Attorney, Agent, or Firm* — Harness, Dickey & Pierce, P.L.C.

(57) ABSTRACT

In one embodiment of the present invention, the present shift register is a shift register provided in a display device by which a partial-screen display is available. The shift register includes a shift stopping circuit that is provided in an in-between stage, and stops operation of the shift register between a first stage and a last stage of the shift register in partial-screen display. The shift register also includes a circuit that is provided in a stage other than the in-between stage in such a manner that the circuit does not perform signal processing but serves as a signal path. The circuit is same as the shift stopping circuit in configuration. The foregoing allows improvement in display quality of the display device employing the present shift register.

16 Claims, 24 Drawing Sheets

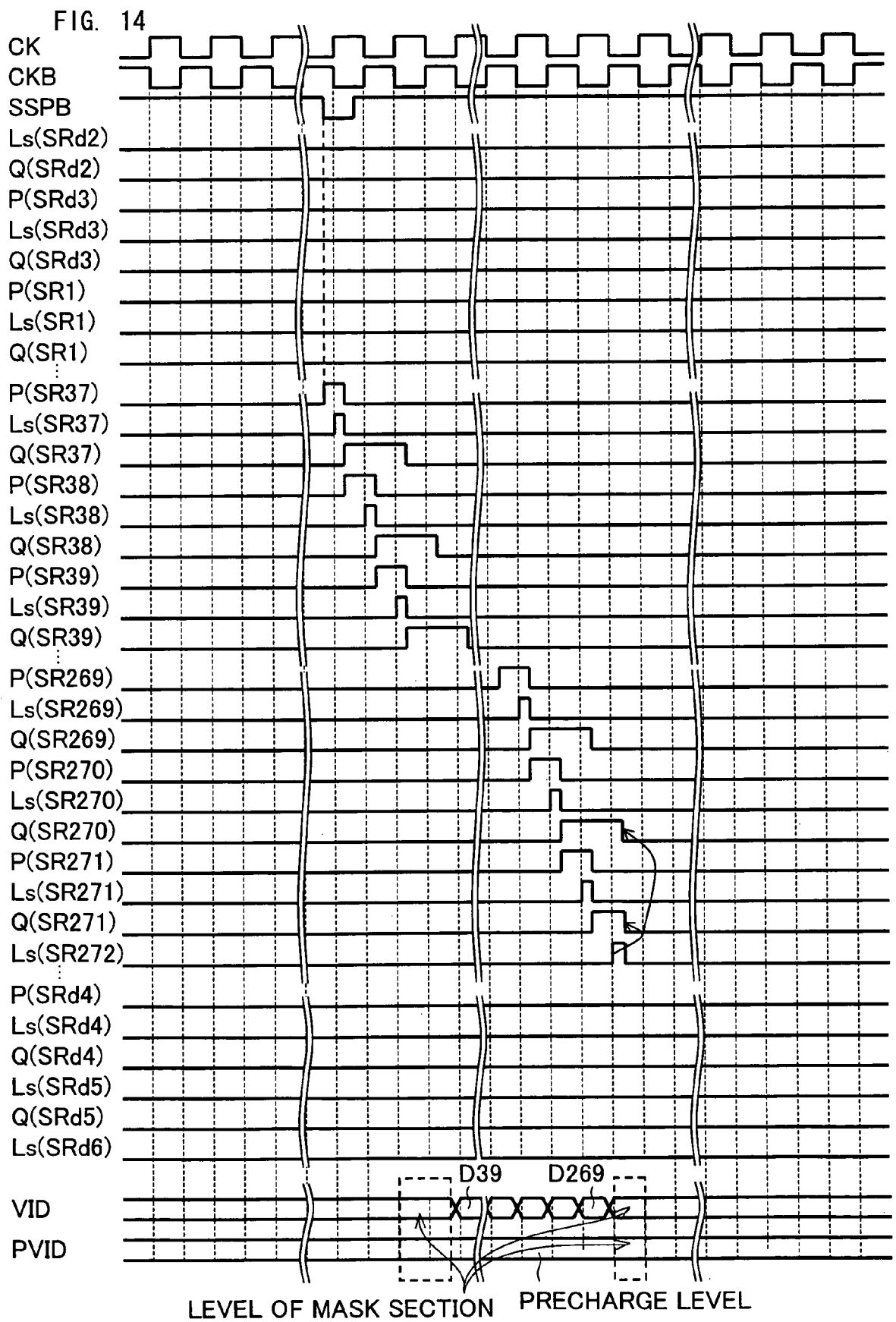

| INPUT | | OUTPUT | | | |
|---|---|---|---|---|---|
| ASPEC | LR | WL | WR | NL | NR |
| H | H | H | L | L | L |
| H | L | L | H | L | L |
| L | H | L | L | H | L |
| L | L | L | L | L | H |

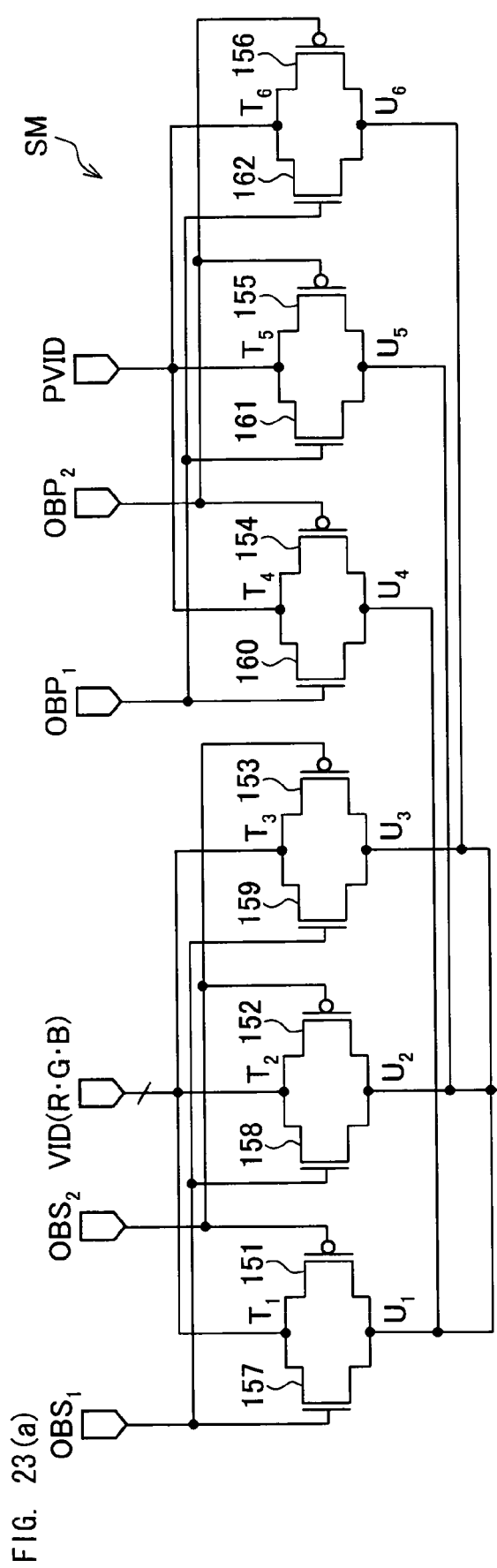
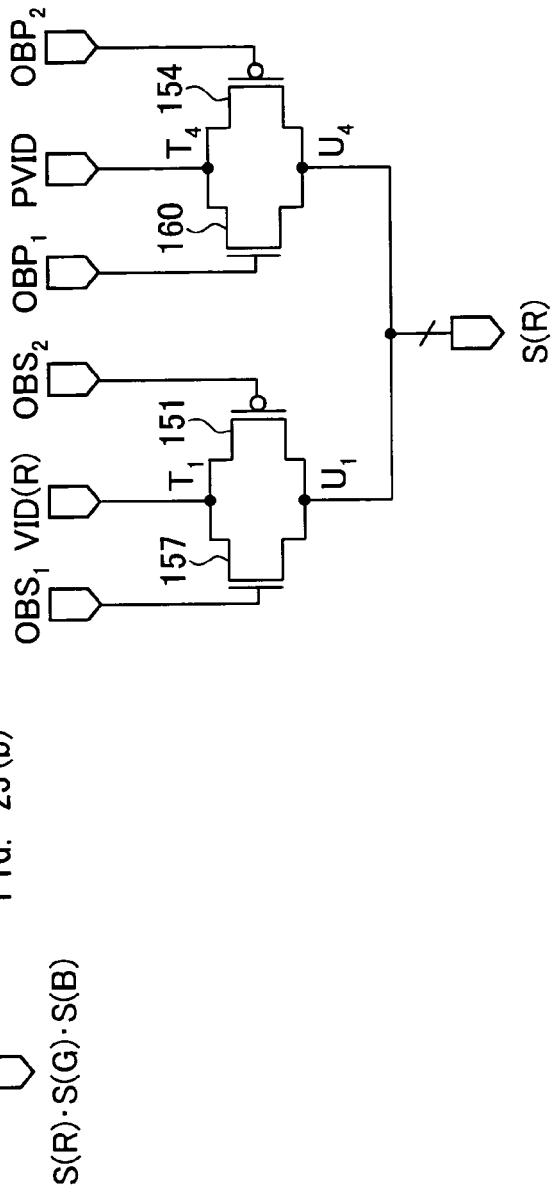
FIG. 23 (a)
FIG. 23 (b)

SHIFT REGISTER, CIRCUIT DRIVING DISPLAY DEVICE, AND DISPLAY DEVICE

TECHNICAL FIELD

The present invention relates to a circuit that drives a display device such as a liquid crystal display device, and particularly, relates to a shift register thereof.

BACKGROUND ART

FIG. 25 is a circuit diagram showing a configuration of a conventional active matrix display device. As shown in this figure, the active matrix display device includes pixels (PXL) arranged in matrix on a horizontally oriented screen. Rows of the pixels are respectively connected to gate lines 201. The gate lines are connected to a vertical driver (vertical driving circuit) 202. On the other hand, columns of the pixels are respectively connected to data lines 203. Further, a signal line 204 is provided to feed a video signal (image signal) Vsig to the pixels. The signal line 4 is connected to the respective data lines 203 via sampling switches SW. The sampling switches operate to open and close sequentially in accordance with a control by a horizontal shift register (SR) via a horizontal driver 205.

The columns of the pixels of the horizontally oriented screen are divided into a predetermined section and extended sections. The predetermined section is assigned to a normal display. The extended sections each become a part of a wide display. The predetermined section contains pixels of the $L+1^{th}$ column to the $M^{th}$ column. The extended sections contain pixels of the $1^{st}$ column to the $L^{th}$ column, and pixels of the $M+1^{th}$ to the $N^{th}$ column. The horizontal shift register (SR) is divided into a predetermined-stage section (SRB) and extended-stage sections (SRA, SRC). The predetermined-stage section corresponds to the columns of the pixels in the predetermined section. The extended-stage sections (SRA, SRC) correspond to the columns of the pixels in the extended sections. In wide display, the predetermined-stage section (SRB) and the extended-stage sections (SRA, SRC) of the horizontal shift register are coupled serially to combine, and open and close all of the sampling switches sequentially. In normal display, the extended-stage sections (SRA, SRC) of the horizontal shift register are decoupled from the predetermined-stage section (SRB) so that only the sampling switches belonging to the predetermined section are opened and closed sequentially.

With this conventional arrangement, the horizontal shift register is divided into three sections: the extended front-stage section SRA; the predetermined in-between stage section SRB; and the extended rear-stage section SRC. A first gate circuit G0 is connected to an input terminal of the extended front-stage section SRA. A second gate circuit G1 is provided across an output terminal of the extended front-stage section SRA and an input terminal of the predetermined in-between stage section SRB. A third gate circuit G2 is provided across an output terminal of the predetermined in-between stage section SRB and an input terminal of the extended rear-stage section SRC. The gate circuits G0, G1, G2 are controlled to switch in accordance with control signals CTL0, CTL1, CTL2 to selectively combine and decouple the horizontal shift register. The first gate circuit G0, which is provided at a front end, is fed with a start signal ST for the shift register.

In the foregoing arrangement, the control signals CTL0, CTL1, CTL2 are all set to Low-level in wide display by an external control circuit. In some cases, the signals CTL0, CTL1, CTL2 may be fed via a shared control line. If CTL0 is set to Low-level in wide display, the start signal ST having been fed into the first gate circuit G0 is fed into the extended front-stage section SRA of the horizontal shift register. SRA transfers the start signal ST sequentially in synchronization with a predetermined clock signal to sequentially open, via the horizontal driver 205, the sampling switches SW that correspond to the pixels of the $1^{st}$ column to the $L^{th}$ column. Consequently, the video signal Vsig supplied from the signal line 204 is sampled by the data lines 203 that correspond to the pixels of the $1^{st}$ column to the $L^{th}$ column. Next, an output signal from the extended front-stage section SRA is fed into an input terminal of the predetermined in-between stage section SRB. SRB, in the same manner, transfers the signal to sequentially control the driving of the corresponding pixels of the $L+1^{th}$ column to the $M^{th}$ column. The output signal of SRB is fed into the extended rear-stage section SRC. SRC, in the same manner, transfers the signal to sequentially control the driving of the corresponding pixels of the $M+1^{th}$ column to the $N^{th}$ column. As a result of the foregoing operation, the pixels of the $1^{st}$ column to the $N^{th}$ column are all driven sequentially to show a wide display.

On the other hand, the start signal ST having been fed into the first gate circuit G0 is fed into the second gate circuit G1 in normal display. Thus, the extended front-stage section SRA of the horizontal shift register is decoupled. Therefore, the start signal ST is fed into the input terminal of the predetermined in-between stage section SRB. SRB transfers the start signal ST sequentially to drive the pixels of the $L+1^{th}$ column to the $M^{th}$ column via the horizontal driver 205 and the switching devices SW. The output signal of the SRB cannot pass through the third gate circuit G2. Thus, the extended rear-stage section SRC is decoupled. Accordingly, the SRB transfers the signals only in normal display.

With the above-described conventional arrangement, the horizontal shift register constituted by flip-flops that are connected so as to form multi-stages is divided into the predetermined-stage section and the extended-stage sections. The predetermined-stage section corresponds to the normal display. The extended-stage sections correspond to the extended section in wide display. The predetermined-stage section and the extended-stage sections are connected via the gate circuits. In wide display, the predetermined-stage section and the extended-stage sections are connected serially via the gate circuits to combine. In normal display, the extended-stage sections are decoupled from the predetermined-stage section. Accordingly, it is possible to switch the wide display and the normal display with a simple arrangement in which the gate circuits are added to the horizontal shift register that is divided.

[Publication 1] Japanese Unexamined Patent Publication No. 20816/1995 (Tokukaihei 7-20816) (Publication Date: Jan. 24, 1995)

DISCLOSURE OF INVENTION

However, with the conventional arrangement, the shift register is divided into three sections, namely the extended front-stage section SRA, the predetermined in-between stage section SRB, and the extended rear-stage section SRC. In normal display, SRA and SRC are decoupled so that only SRB operates. This makes it necessary to stop the shifting at end sections of SRB. Therefore, a special stage that is different from the other stages is provided at the ends of SRB (at in-between sections of the entire shift register). Providing the stage of different configuration at a section (in-between section) other than the end sections of the shift register causes the loads to vary, which causes signal defects such as phase shift. This causes deterioration in display quality.

The present invention is in view of the foregoing problem, and has as an object to provide a shift register for a display-device driving circuit to realize high-quality display.

To solve the above problem, a display device of the present invention is adapted so that the shift register provided in a display device by which a partial-screen display is available includes: a shift stopping circuit that is provided in an in-between stage, and stops operation of the shift register between a first stage and a last stage of the shift register in partial-screen display; and a circuit that is provided in a stage other than the in-between stage in such a manner that the circuit does not perform signal processing but serves as a signal path, and is same as the shift stopping circuit in configuration. Note that in partial-screen display, a non-display section and a display section are formed on the display section. The in-between stage corresponds to the display section.

With this arrangement, a circuit that is same as the shift stopping circuit in configuration is provided in respective stages other than the in-between stage, in which the shift stopping circuit is provided. The circuit is provided in the respective stages other than the in-between stage in such a manner that the circuit does not perform signal processing but serves as a signal path. Making the stages of the shift register uniform in configuration equalizes the signal loads of the stages. This significantly reduces lags (phase shift) in signal delays among the stages. Thus, signal defects resulting from the lags in signal delays among the stages are restrained, so that high-quality display is realized.

To solve the above problem, a shift register of a display device of the present invention is adapted so that the shift register, provided in a display device by which a partial-screen display is available, includes: a shift starting circuit that is provided in an in-between stage, and starts operation of the shift register between a first stage and a last stage of the shift register in partial-screen display; and a circuit that is provided in a predetermined stage other than the in-between stage in such a manner that the circuit does not perform signal processing but serves as a signal path, and is same as the shift starting circuit in configuration.

With this arrangement, a circuit that is same as the shift starting circuit in configuration is provided in respective stages other than the in-between stage, in which the shift starting circuit is provided. The circuit is provided in the respective stages other than the in-between stage in such a manner that the circuit does not perform signal processing but serves as a signal path. Thus, signal loads of the stages are equalized so that lags (phase shift) in signal delays among the stages are reduced significantly. Therefore, signal defects resulting from the lags in signal delays among the stages are restrained, so that high-quality display is realized.

It is preferable in the shift register that each stage of the shift register includes a selecting circuit that selects a shifting direction to enable the shift register to shift in two directions. It is also possible to arrange in such a manner that the shift starting circuit or the shift stopping circuit functions so as to select the shifting direction and constitutes a part of the selecting circuit.

Each stage of the shift register may include a set-reset flip-flop.

The shift register of the display device of the present invention is adapted so that the shift register provided to a driving circuit of a display device includes a load adjusting circuit that is provided in a predetermined stage, and equalizes respective signal loads of stages.

With the foregoing arrangement, signal loads of the stages are equalized so that lags (phase shift) in signal delays among the stages are reduced significantly. Therefore, the signal defects resulting from the lags in signal delays among the stages are restrained, so that high-quality display is realized.

In the shift register, the load adjusting circuit may be provided in such a manner that the load adjusting circuit does not perform signal processing but serves as a signal path.

In the shift register, a signal processing circuit that is same as the load adjusting circuit in configuration and performs a predetermined signal processing may be provided in a stage other than the predetermined stage.

A driving circuit of a display device of the present invention is adapted so that the driving circuit includes the shift register.

A display device of the present invention is adapted so that the display device includes the driving circuit for the display device.

As the foregoing describes, the shift register of the present invention includes, in respective stages other than the in-between stage in which the shift stopping circuit is provided, a circuit that is provided in such a manner that the circuit does not perform signal processing but serves as a signal path. The circuit is same as the shift stopping circuit in configuration. Making the stages of the shift register uniform in configuration equalizes signal loads of the stages. This significantly reduces lags (phase shift) in signal delays among the stages. Therefore, signal defects resulting from the lags in signal delays among the stages are restrained, so that high-quality display is realized.

Figure 6:
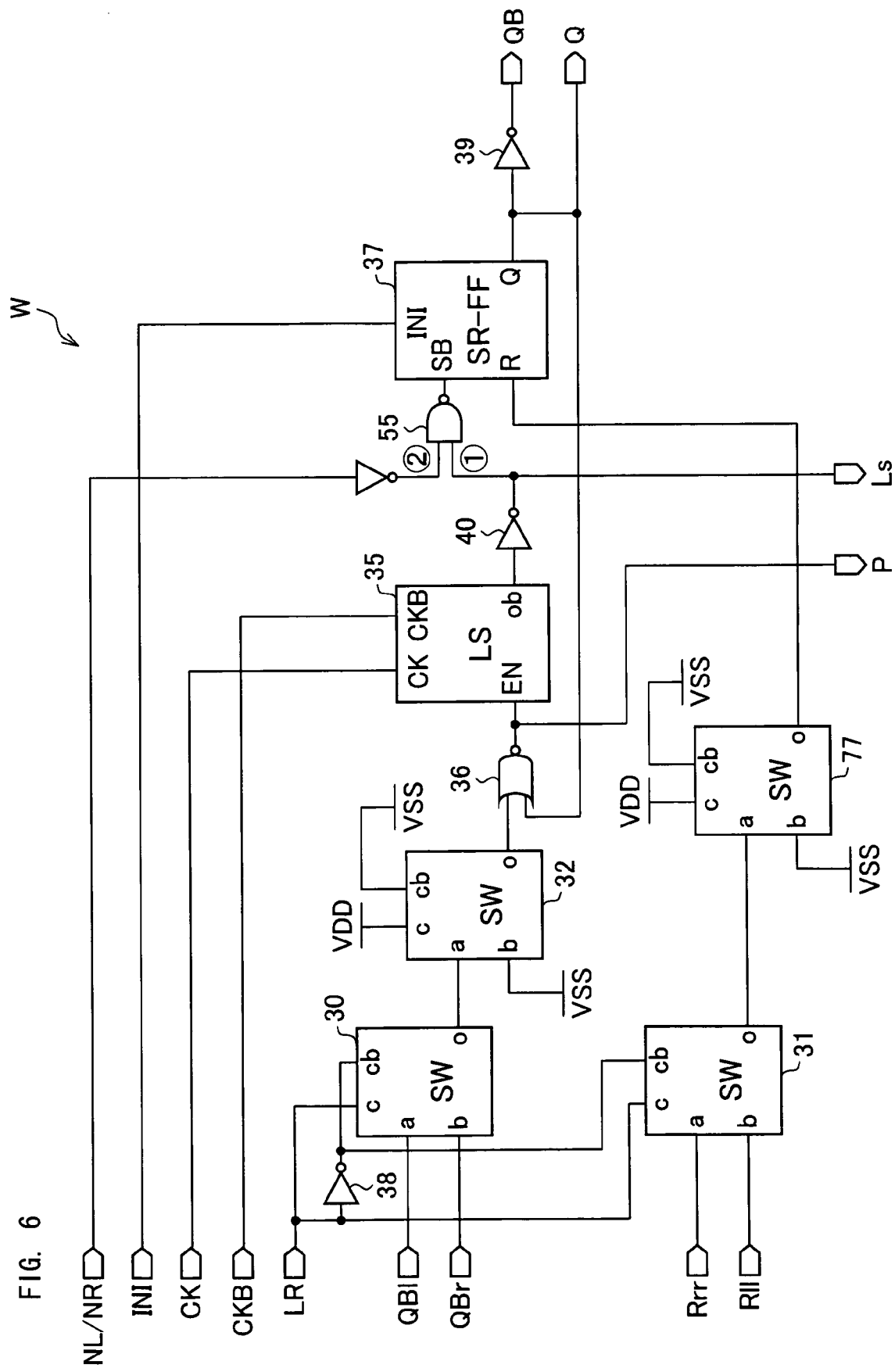
FIG. 6
This is a circuit diagram showing a configuration of a shift register circuit.

This is a timing diagram showing operation of the shift register circuit shown in FIG. 6.

FIG. 8

This is a circuit diagram showing a configuration of a shift register circuit.

FIG. 9(a)

Figure 8:
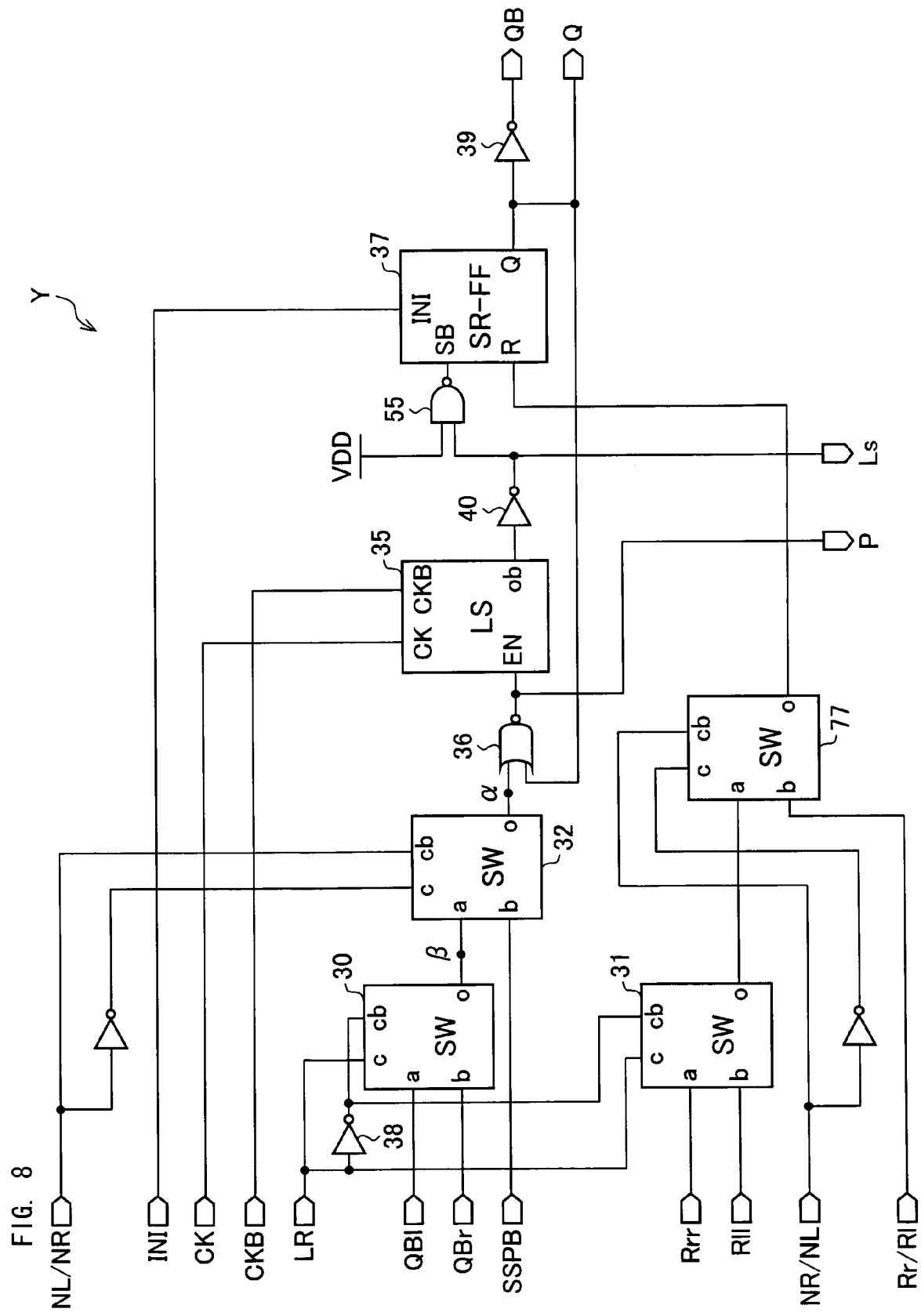

This is a timing diagram showing operation of the shift register circuit shown in FIG. 8.

FIG. 9(b)

This is a timing diagram showing operation of the shift register circuit shown in FIG. 8.

FIG. 10(a)

This is a timing diagram showing operation of the shift register circuit shown in FIG. 8.

FIG. 10(b)

This is a timing diagram showing operation of the shift register circuit shown in FIG. 8.

FIG. 11

This is a circuit diagram showing a configuration of a shift register circuit.

FIG. 12(a)

Figure 11:
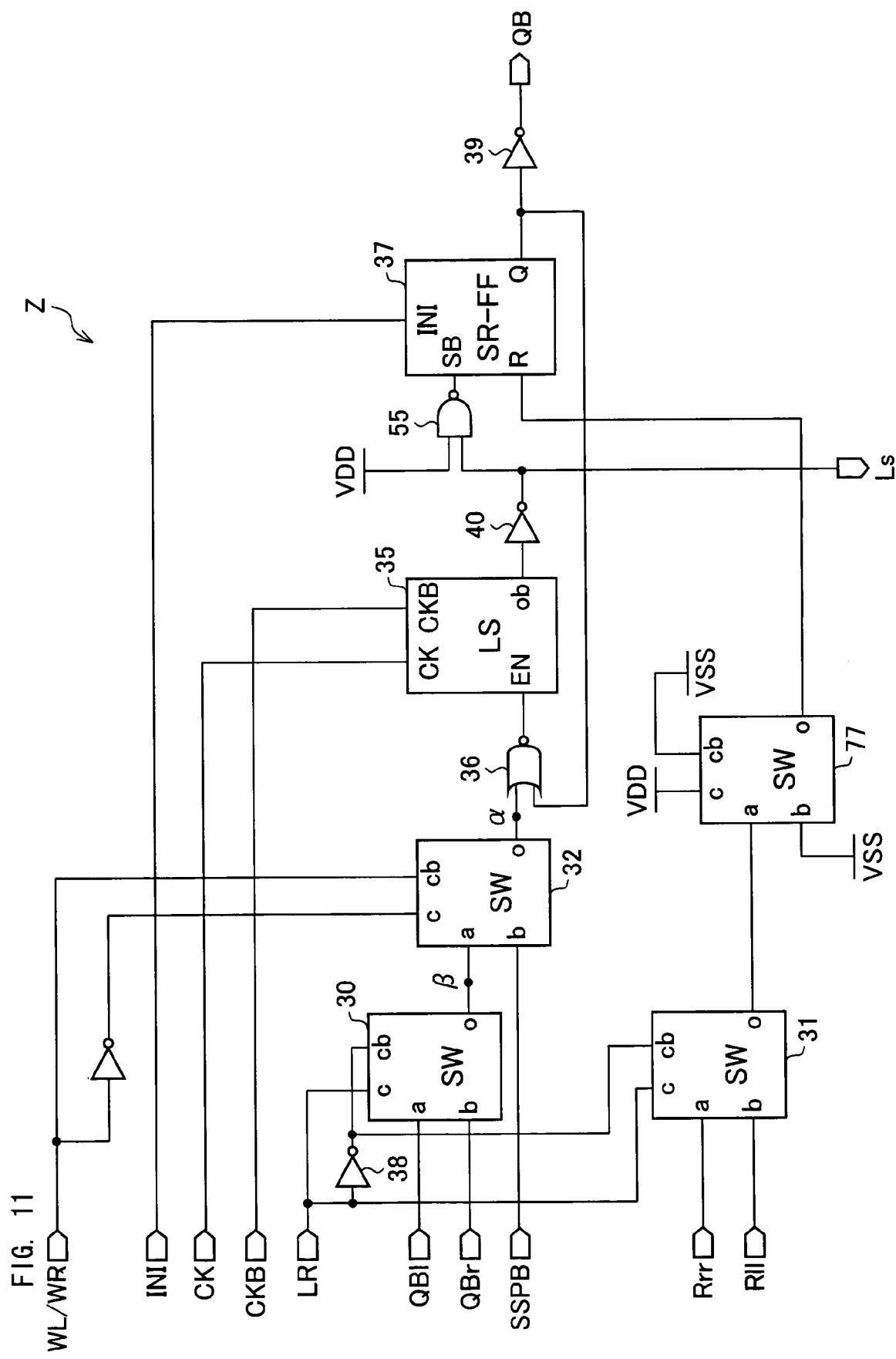

This is a timing diagram showing operation of the shift register circuit shown in FIG. 11.

FIG. 12(b)

This is a timing diagram showing operation of the shift register circuit shown in FIG. 11.

FIG. 13

This is a timing diagram showing operation of the shift register (in wide display).

FIG. 14

This is a timing diagram showing operation of the shift register (in partial-screen display).

FIG. 15(a)

This is a diagram showing a logic circuit to set a display mode and a shifting direction.

FIG. 15(b)

Figures 15A, 15B:
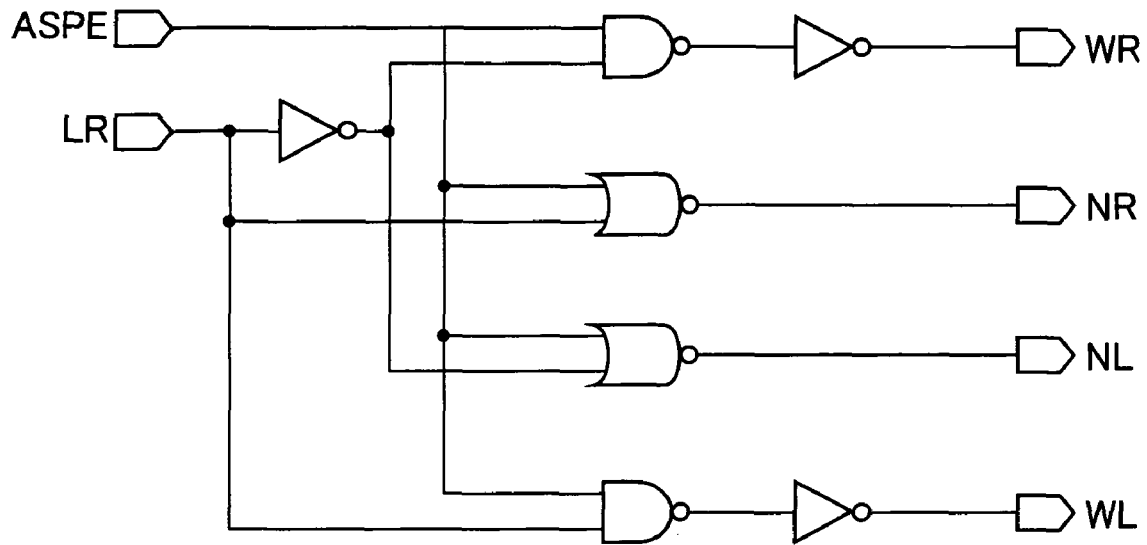

This is a truth table of the logic circuit shown in FIG. 15(a).

FIG. 16

This is a circuit diagram showing a configuration of an SR-FF (set-reset flip-flop).

FIG. 17

This is a circuit diagram showing a configuration of the level shifter.

FIG. 18(a)

This is a circuit diagram showing a configuration of a switch circuit that can replace the level shifter.

FIG. 18(b)

Figure 18A:
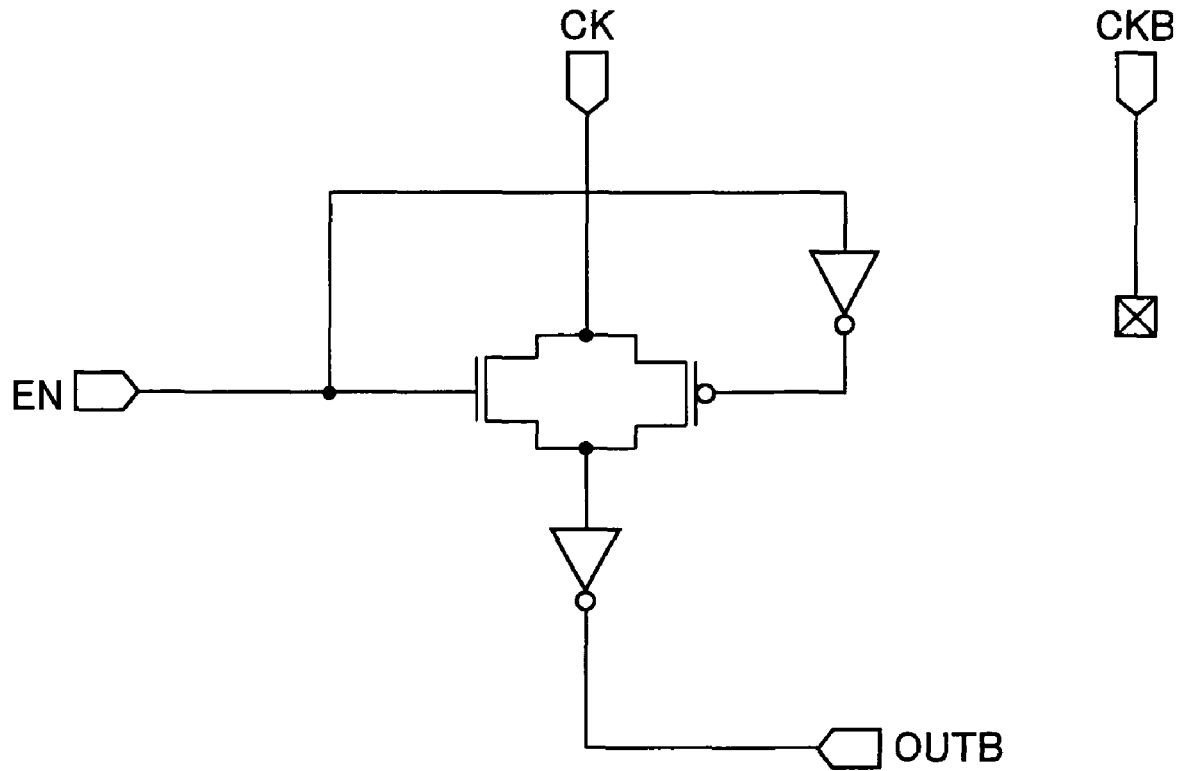

This is a timing diagram showing operation of the switch circuit shown in FIG. 18(a).

FIG. 19

This is a circuit diagram showing a configuration of a switch provided to the shift register circuit.

FIG. 20(a)

This is a circuit diagram showing a configuration of a delay circuit.

FIG. 20(b)

This is a circuit diagram showing a configuration of the delay circuit.

FIG. 21(a)

This is a circuit diagram showing a configuration of a buffer circuit.

FIG. 21(b)

This is a circuit diagram showing a configuration of the buffer circuit.

FIG. 22(a)

Figure 20A:
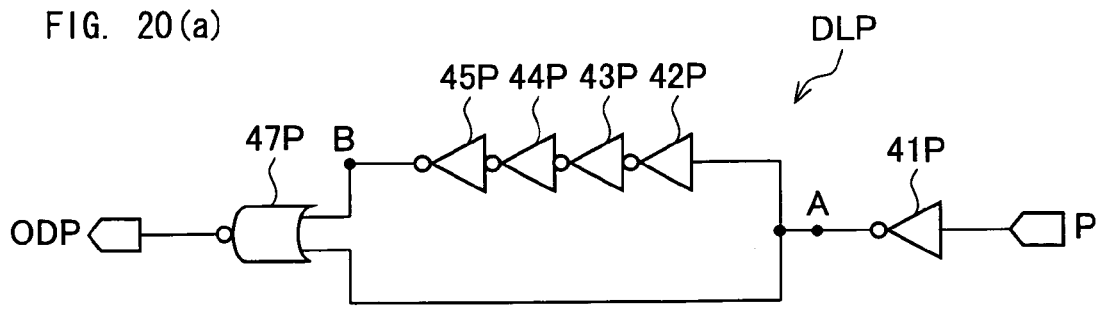
Figure 20B:
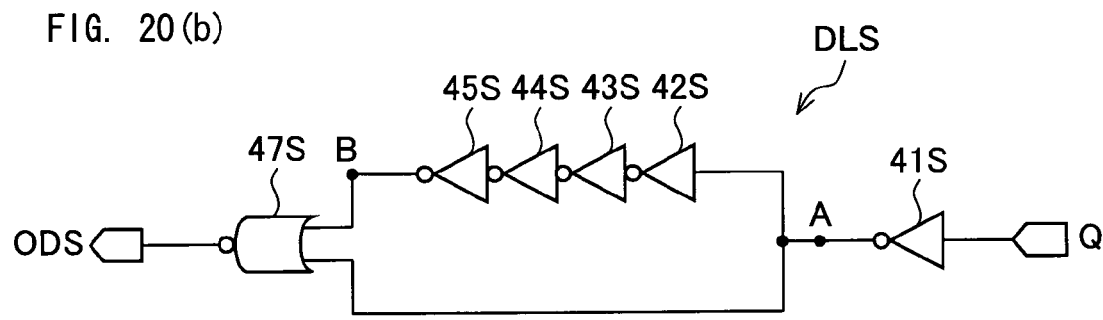

This is a timing diagram showing operation of the delay circuit shown in FIGS. 20(a) and 20(b).

FIG. 22(b)

This is a timing diagram showing operation of the delay circuit shown in FIGS. 20(a) and 20(b).

FIG. 23(a)

This is a circuit diagram showing a configuration of a sampling circuit.

FIG. 23(b)

This is a circuit diagram showing a part of the sampling circuit shown in FIG. 23(a).

FIG. 24

This is a circuit diagram showing a configuration of a mask switch circuit.

FIG. 25

This is a circuit diagram showing a configuration of a conventional display device.

EXPLANATION OF REFERENCE 1 display device
2 shift register
3 buffer circuit section
4 delay circuit section
5 wide-display section (mask section)
6 normal-display section
7 dummy pixel section
8 sampling circuit section
9 mask switch circuit section
30-32 switches
55 NAND
35 level shifter
36 NOR
77 switch
SR shift register circuit
DL delay circuit
Bu buffer circuit
SM sampling circuit
S output line
L2 precharge line
L3 video line

BEST MODE FOR CARRYING OUT THE INVENTION

Figure 2:
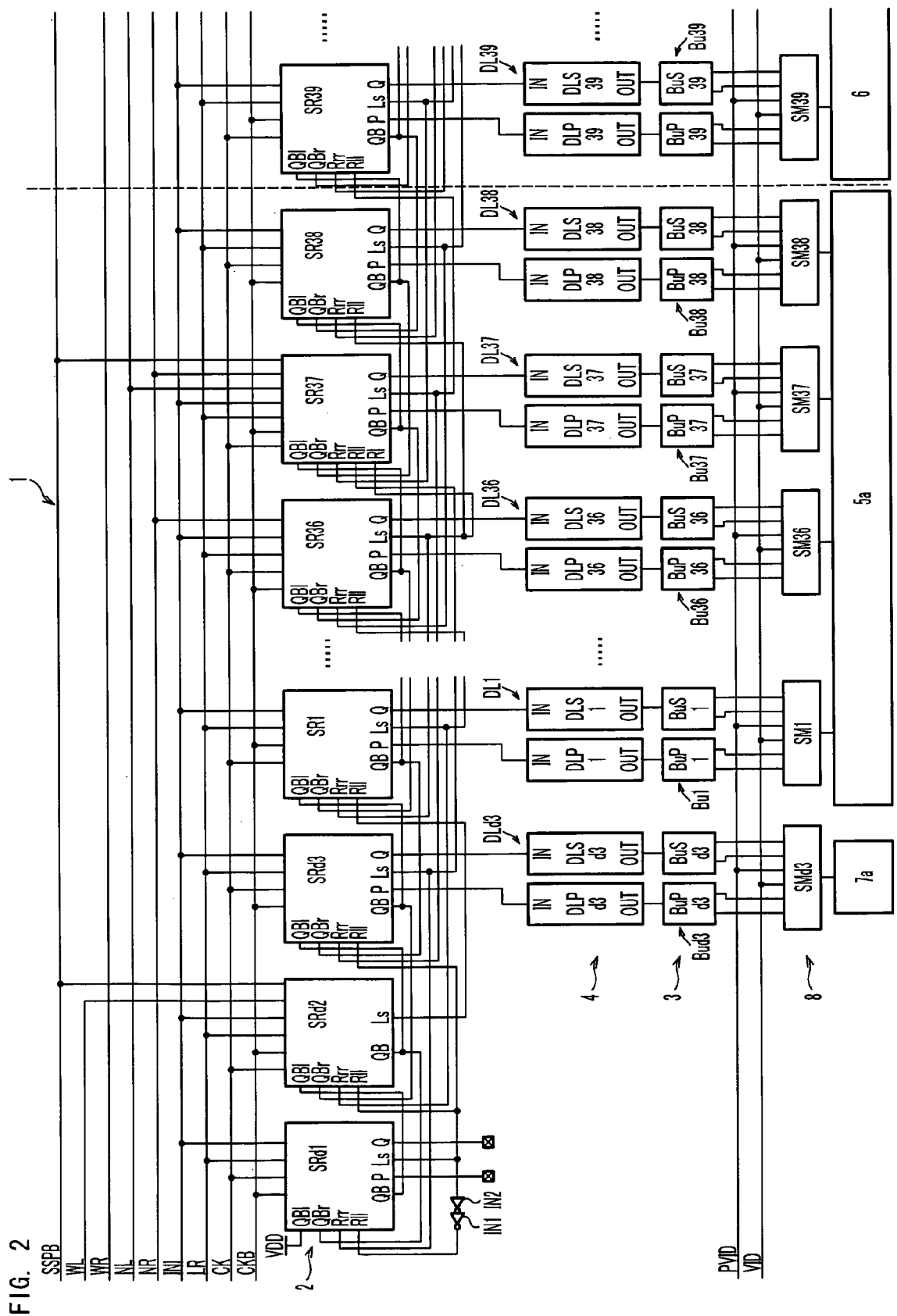
FIG. 2
This is a circuit diagram showing a partial configuration of the present display device.
Figure 3:
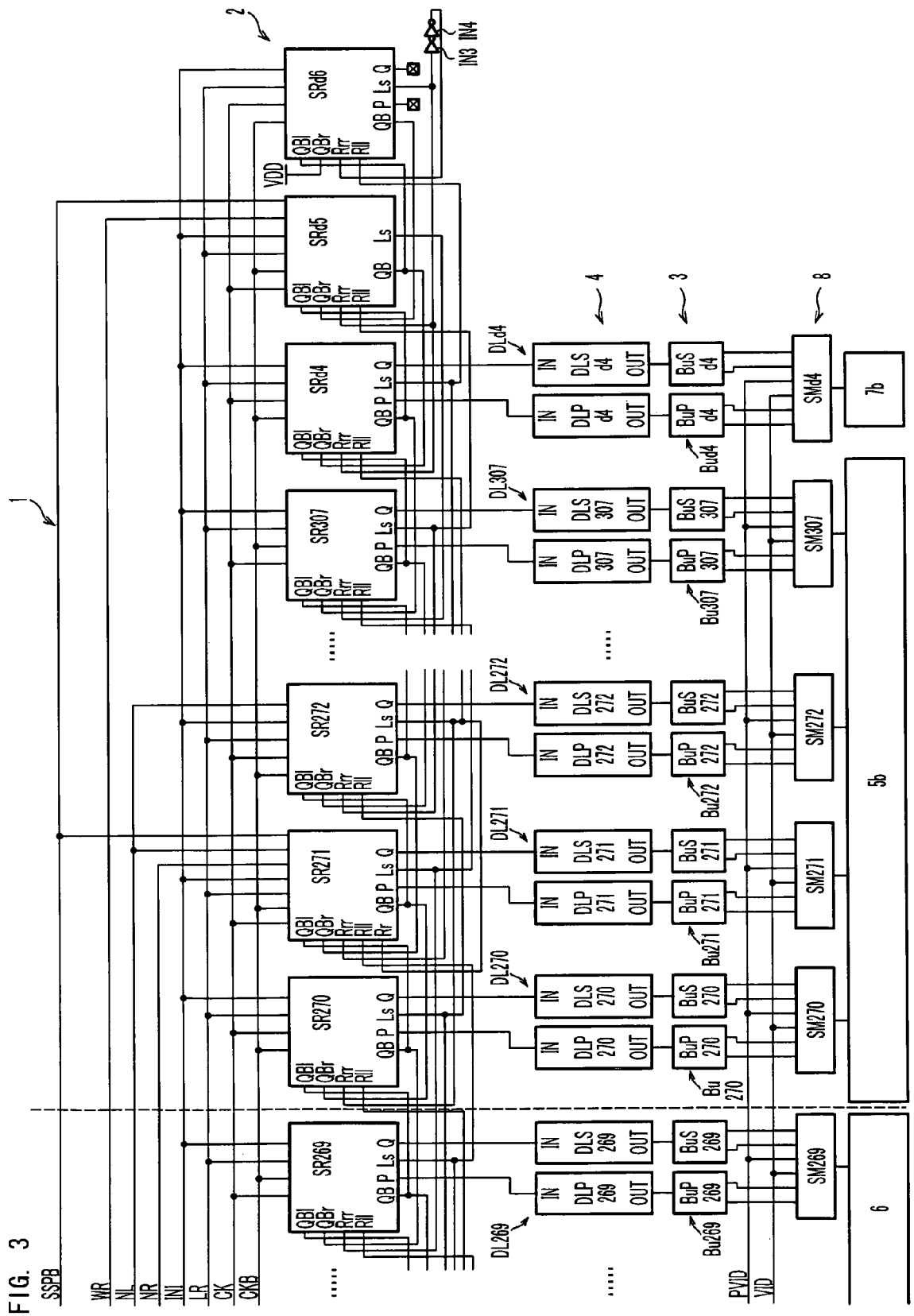
FIG. 3
This is a circuit diagram showing a partial configuration of the present display device.
Figure 4:
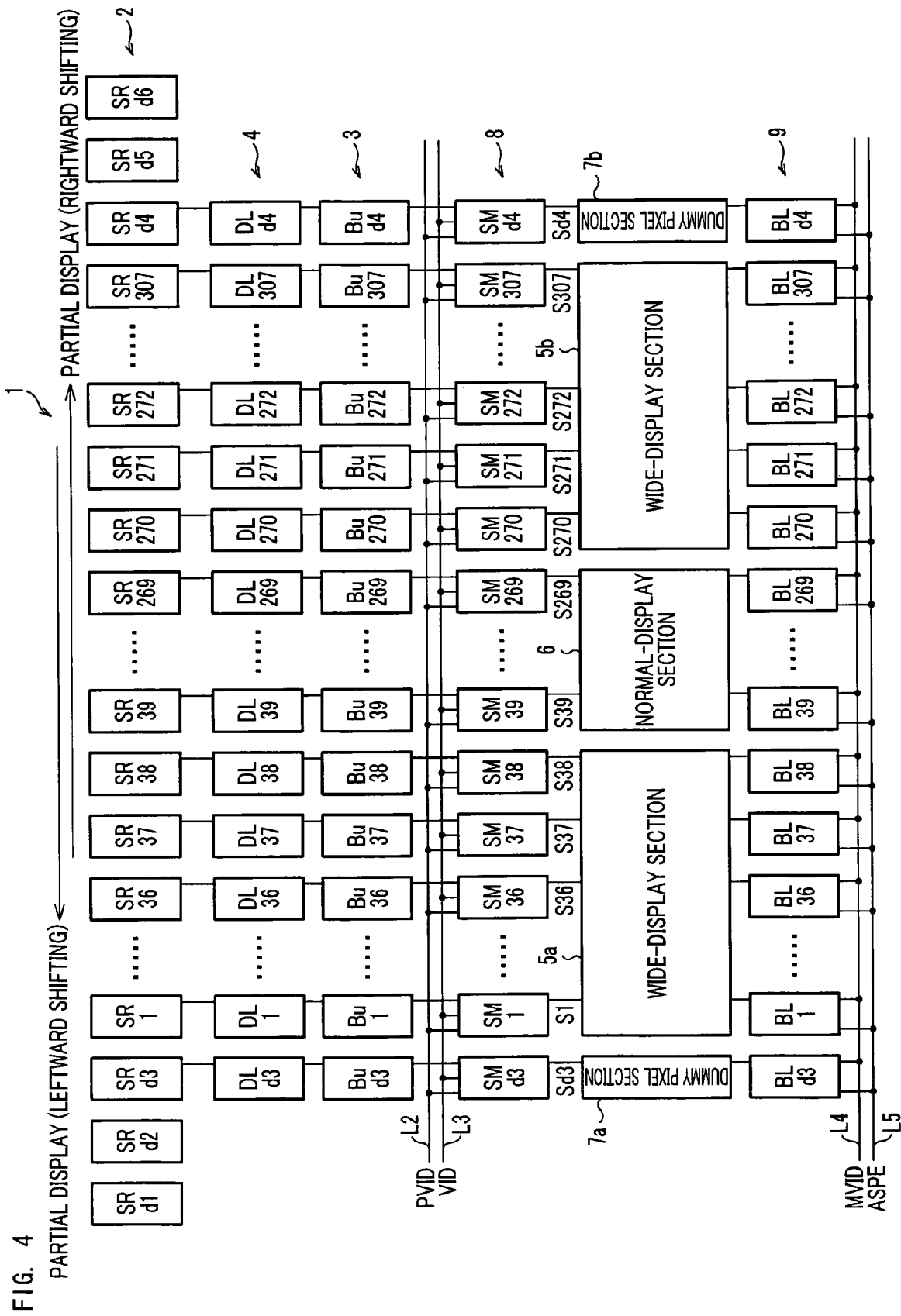
FIG. 4
This is a circuit diagram showing a configuration of a display device in accordance with Embodiment 1.

The following describes an exemplary embodiment of the present invention. FIGS. 2 to 4 are circuit diagrams showing a configuration of a display device 1 of the present embodiment. FIGS. 2 and 3 together correspond to FIG. 4. As showing in those figures, the display device 1 (e.g. liquid crystal display device) includes a source driver and a display section. The source driver includes a shift register 2, a delay circuit section 4, a buffer circuit section 3, sampling circuit section 8, and a mask switch circuit section 9. The display section includes an output line S (Sd3, S1 to S307, and Sd4), a normal-display section 6, wide-display sections (mask section) 5a and 5b, and dummy pixel sections 7a and 7b. Illustration of a configuration of those respective sections and connections between or among those sections are omitted in FIG. 4.

The shift register 2 includes a plurality of shift register stages (dummy stages SRd1 to SRd3, stages SR1 to SR307, and dummy stages SRd4 to SRd6, which are listed in the order as they are provided, starting at an end). The delay circuit section 4 includes a plurality of delay circuits (DLd3, DL1 to DL307, and DLd4, which are listed in the order as they are provided, starting at the end). The buffer circuit section 3 includes a plurality of buffer circuits (Bud3, Bu1 to Bu307, and Bud4, which are listed in the order as they are provided, starting at the end). The sampling circuit section 8 includes a plurality of sampling circuits (SMd3, SM1 to SM307, and SMd4, which are listed in the order as they are provided, starting at the end). The mask switch circuit section 9 includes a plurality of switch circuits for masking (BLd3, BL1 to BL307, and BLd4, which are listed in the order as they are provided, starting at the end). The shift register circuit SR includes a plurality of switches SW, SR-FF (set-reset flip-flop), and a level shifter.

The display device 1 includes the following lines for input: L2 (PVID), L3 (VID), L4 (MVID), and L5 (ASPE); and SSPB, WR, WL, NR, NL, INI, LR, CK, and CKB. Each of SSPB, WR, WL, NR, NL, INI, and LR is fed as a signal with an electric potential of either High or Low of the operating voltage to drive the circuit. The CK and CKB each have an amplitude smaller than the difference in electric potential between High and Low of the operating voltage to drive the circuit. Thus, CK and CKB need to be shifted in level to the operating voltage by the level shifter.

FIG. 15(*a*) is a logic circuit showing a relationship between input (ASPE, LR) and output (WL, WR, NL, NR). FIG. 15(*b*) is a truth table of the logic circuit. As shown in FIGS. 15(*a*) and 15(*b*), if ASPE (ASPEC) and LR are both "H", then only WL becomes "H", and the rest of the outputs, namely WR, NL, and NR, each become "L". If ASPE is "H" and LR is "L", then only WR becomes "H", and the rest of the outputs, namely WL, NL, and NR, become "L". If ASPE is "L" and LR is "H", then only NL becomes "H", and the rest of the outputs, namely WL, WR, and NR, become "L". If ASPE and LR are both "L", then only NR becomes "H", and the rest of the outputs, namely WR, WL, and NL, become "L".

Figure 16:
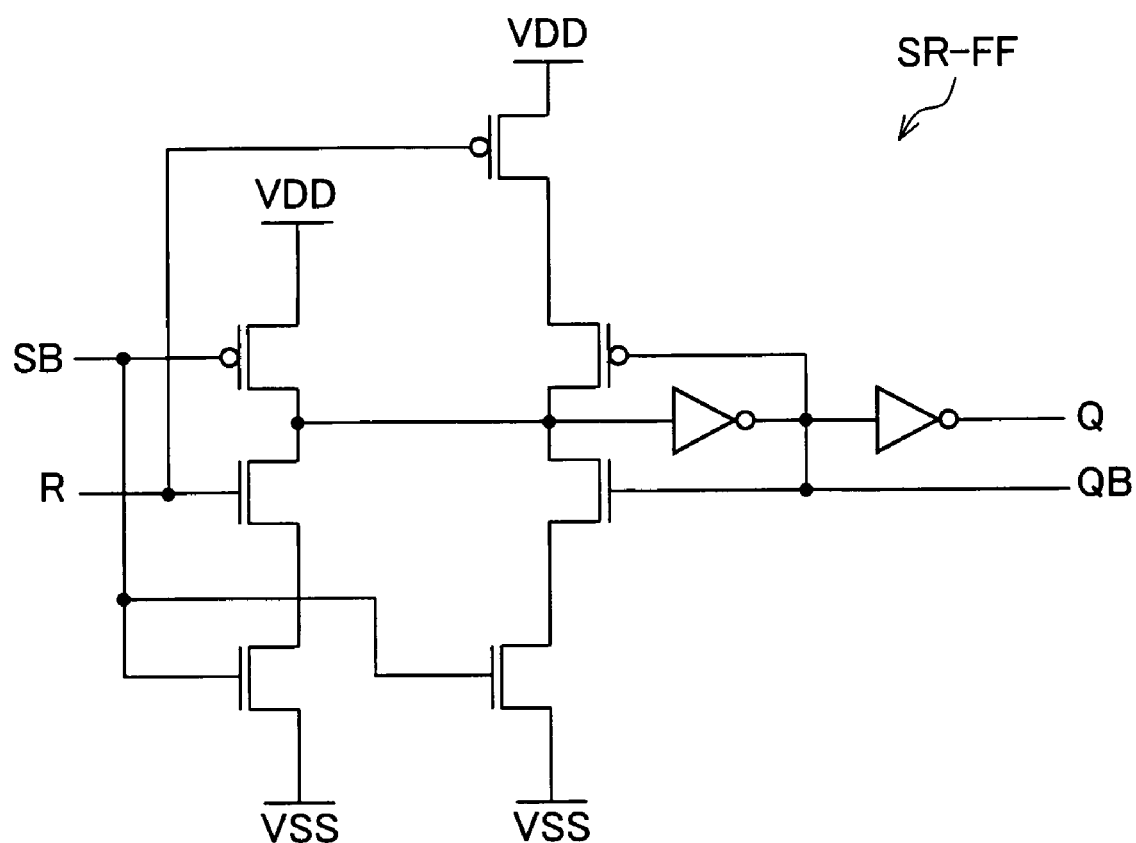

The set-reset flip-flop (SR-FF) provided to the shift register circuit SR is configured by the circuit shown in FIG. 16, for example. If "L" is fed into SB, then an output Q becomes "H (active)", and QB becomes "L (active)". If "H" is fed into a reset R, then the output Q becomes "L", and the output QB becomes "H".

Figure 17:
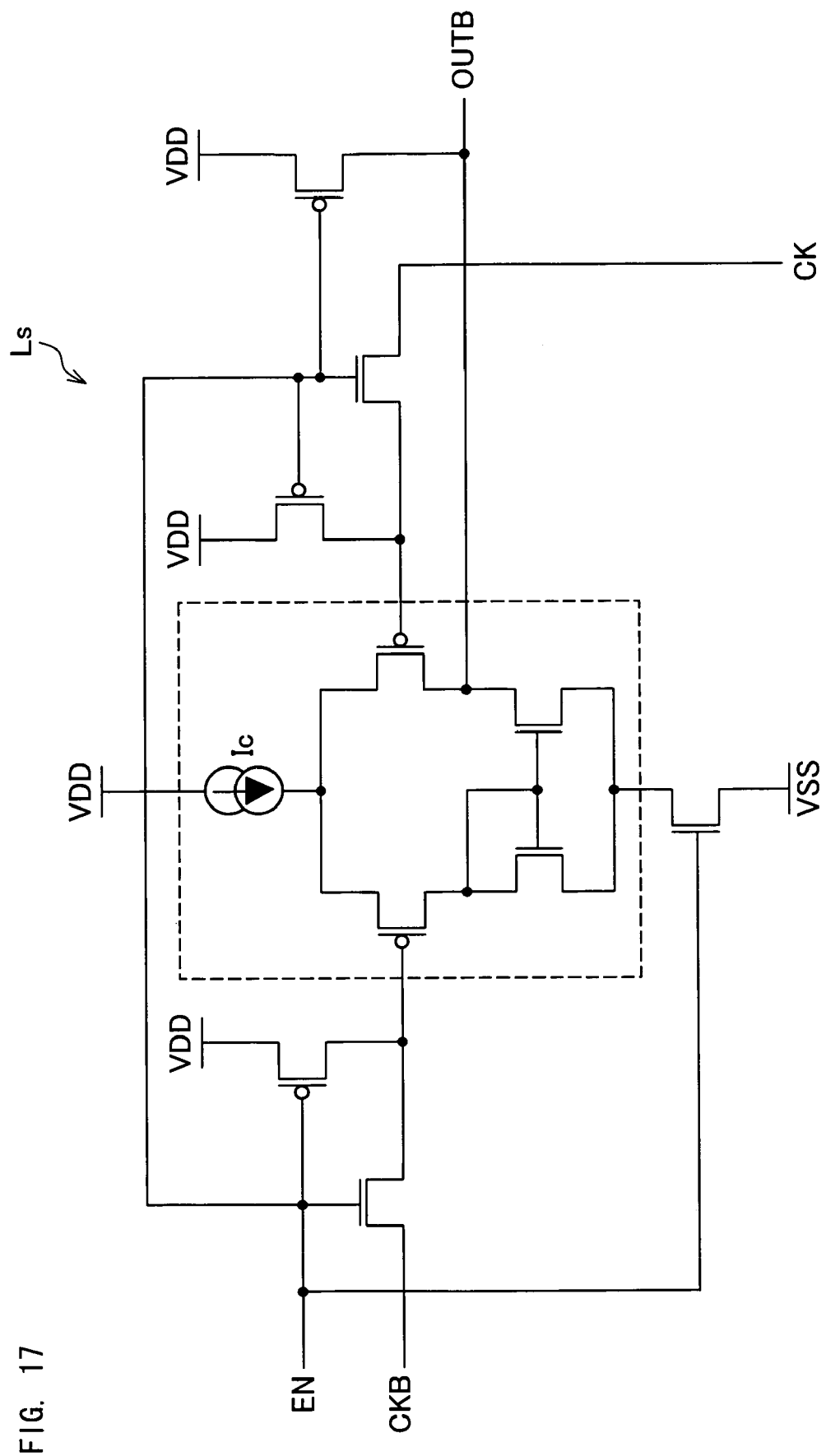
Figure 18B:
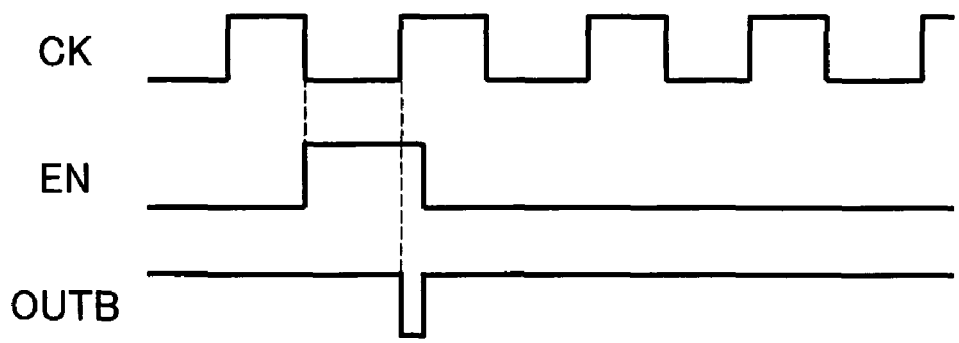

The level shifter provided to the shift register circuit SR is configured by the circuit shown in FIG. 17, for example. If EN is "H (active)", an inversion signal of an input clock (CK or CKB) is shifted in level and then tapped off from OUTB (ob). If EN is "L", "H" is tapped off. It is possible to use the following in place of the level shifter shown in FIG. 17: input signals CK and CKB that are shifted to the level of the operating voltage; a P-channel MOS transistor and an N-channel MOS transistor that are coupled as shown in FIG. 18(*a*); and a switch circuit (gate) having an inverter. The switch circuit operates in the same manner as the level shifter, as shown in FIG. 18(*b*).

Figure 19:
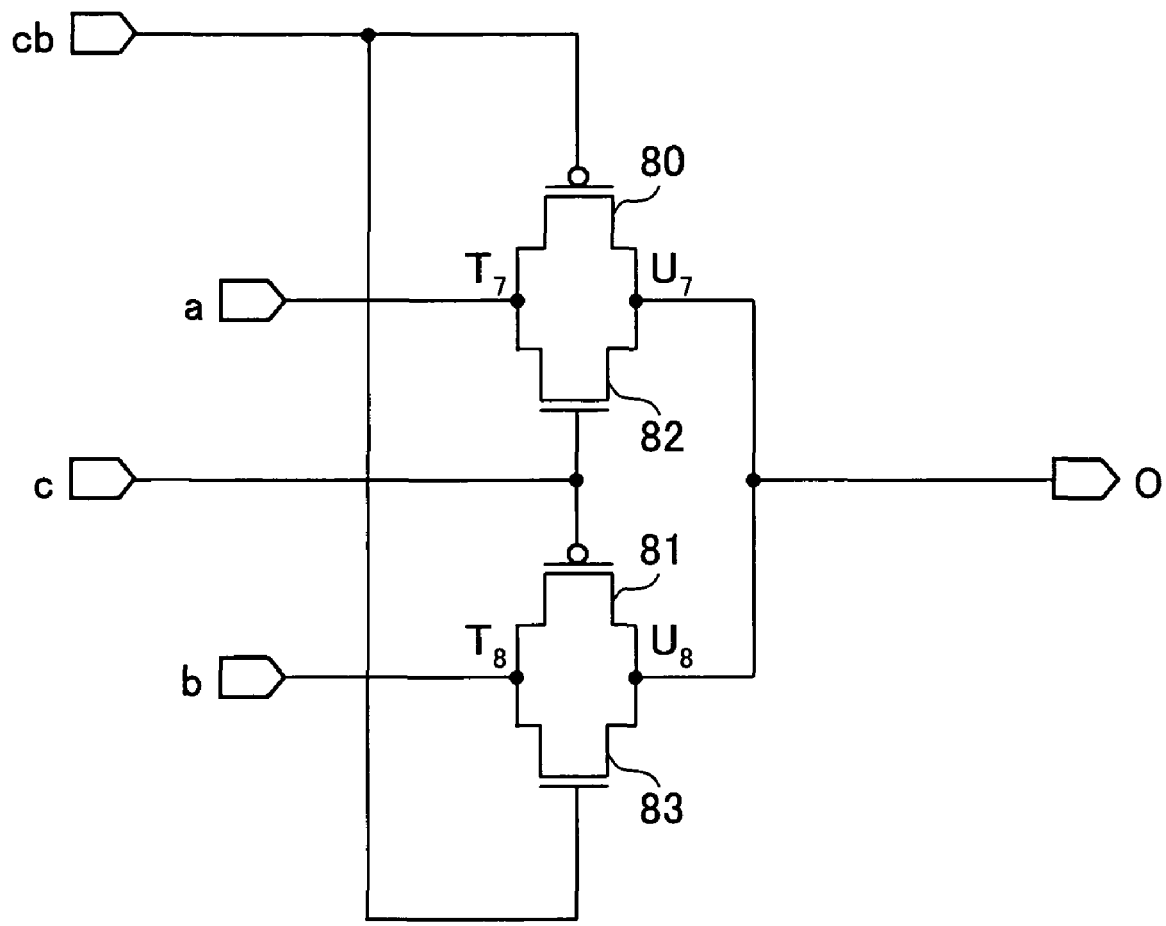

The switch SW provided to the shift register circuit SR is configured as shown in FIG. 19, for example. A P-channel MOS transistor 80 and an N-channel MOS transistor 82 are coupled (a drain of one of the transistors and a source of the other one of the transistors are connected to form a terminal T7, and a source of that one of the transistors and a drain of that the other one of the transistors are connected to form a terminal U7). A P-channel MOS transistor 81 and an N-channel MOS transistor 83 are coupled (a drain of one of the transistors and a source of the other one of the transistors are connected to form a terminal T8, and a source of that one of the transistors and a drain of that the other one of the transistors are connected to form a terminal U8). The terminal T7 and the input-a are connected. The terminal T8 and the input-b are connected. A gate of the transistor 81, a gate of the transistor 82, and the input-c are connected to one another. A gate of the transistor 80, a gate of the transistor 83, and the input-cb are connected to one another. The terminal U7, the terminal U8, and the output-o are connected to one another.

An exemplary configuration of the delay circuit DL is as shown in FIGS. 20(*a*) and 20(*b*). In a precharge delay circuit DLP, an output P of the shift register circuit SR is fed into an inverter 41P. An output of the inverter 41P is fed into both an input of an inverter 42P and one of inputs of a NOR 47P. An output of the inverter 42P is fed into an inverter 43P. An output of the inverter 43P is fed into an inverter 44P. An output of the inverter 44P is fed into an inverter 45P. An output of the inverter 45P is fed into the other one of the inputs of the NOR 47P. An output of the NOR 47P is ODP. In a data delay circuit DLS, an output Q of the shift register circuit SR is fed into an inverter 41S. An output of the inverter 41S is fed into both an input of an inverter 42S and one of inputs of a NOR 47S. An output of the inverter 42S is fed into an input of an inverter 43S. An output of the inverter 43S is fed into an inverter 44S. An output of the inverter 44S is fed into an inverter 45S. An output of the inverter 45S is fed into the other one of the inputs of the NOR 47S. An output of the NOR 47S is ODS.

Figure 21A:
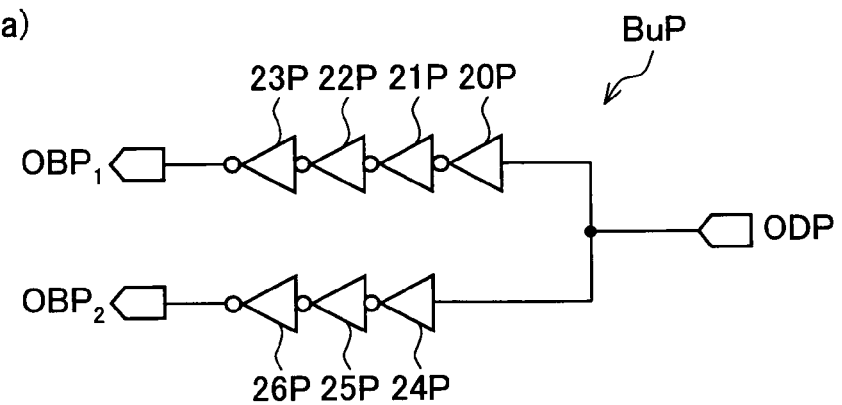
Figure 21B:
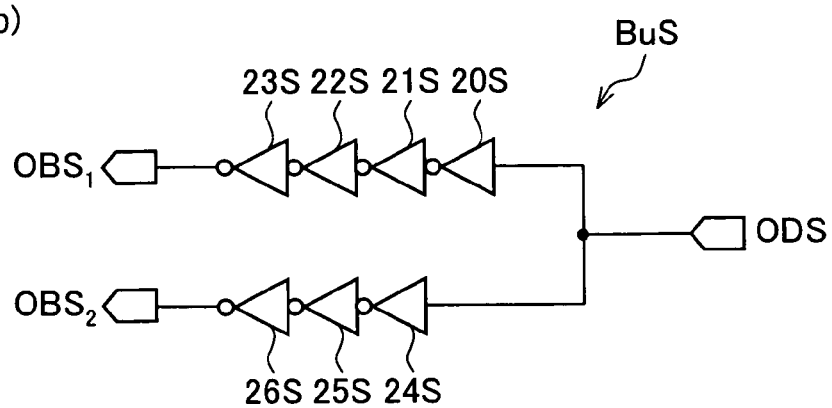

An exemplary configuration of a buffer circuit Bu is as shown in FIGS. 21(*a*) and 21(*b*). In a precharge buffer circuit BuP, the output ODP of the delay circuit DLP is fed into both an inverter 20P and an inverter 24P. An output of the inverter 20P is fed into an inverter 21P. An output of the inverter 21P is fed into an inverter 22P. An output of the inverter 22P is fed into an inverter 23P. An output of the inverter 23P is an output OBP1. An output of the inverter 24P is fed into an inverter 25P. An output of the inverter 25P is fed into an inverter 26P. An output of the inverter 26P is an output OBP2. In a data buffer circuit BuS, the output ODS of the delay circuit DLS is fed into both an inverter 20S and an inverter 24S. An output of the inverter 20S is fed into an inverter 21S. An output of the inverter 21S is fed into an inverter 22S. An output of the inverter 22S is fed into an inverter 23S. An output of the inverter 23S is an output OBS1. An output of the inverter 24S is fed into an inverter 25S. An output of the inverter 25S is fed into an inverter 26S. An output of the inverter 26S is an output OBS2.

Figure 22A:
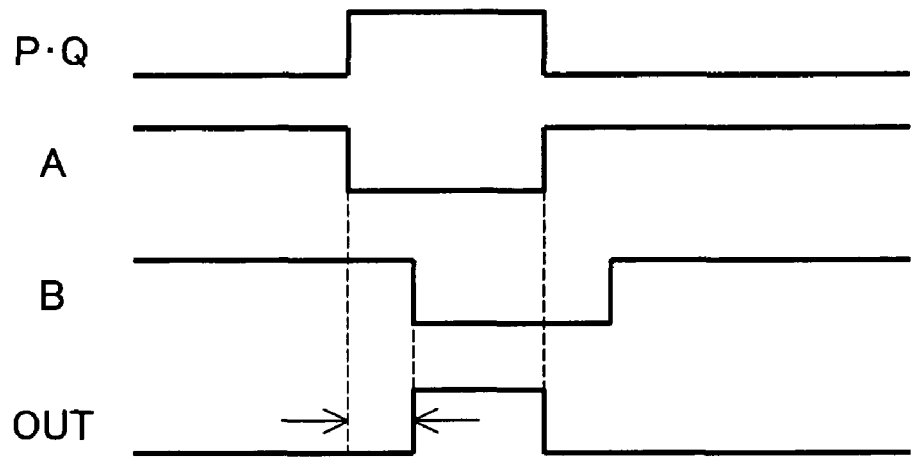
Figure 22B:
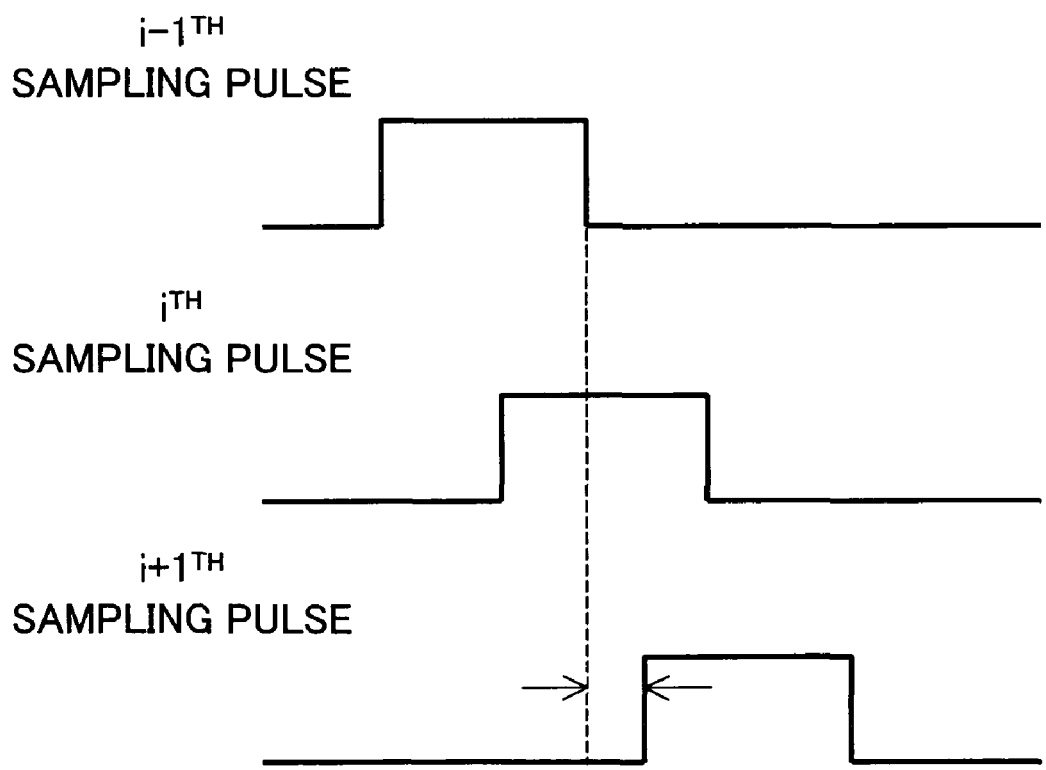

FIGS. 22(*a*) and 22(*b*) each show operation of the respective delay circuits DL (precharge delay circuit and data delay circuit) shown in FIGS. 20(*a*) and 20(*b*).

An exemplary configuration of the sampling circuit SM is as shown in FIG. 23(*a*). A P-channel MOS transistor 151 and an N-channel MOS transistor 157 are coupled (a drain of one of the transistors and a source of the other one of the transistors are connected to form a terminal T1, and a source of that one of the transistors and a drain of that the other one of the transistors are connected to form a terminal U1). A P-channel MOS transistor 152 and an N-channel MOS transistor 158 are coupled (a drain of one of the transistors and a source of the other one of the transistors are connected to form a terminal T2, and a source of that one of the transistors and a drain of that the other one of the transistors are connected to form a terminal U2). A P-channel MOS transistor 153 and an N-channel MOS transistor 159 are coupled (a drain of one of the transistors and a source of the other one of the transistors are connected to form a terminal T3, and a source of that one of the transistors and a drain of that the other one of the transistors are connected to form a terminal U3). A P-channel MOS transistor 154 and an N-channel MOS transistor 160 are coupled (a drain of one of the transistors and a source of the other one of the transistors are connected to form a terminal T4, and a source of that one of the transistors and a drain of that the other one of the transistors are connected to form a terminal U4). A P-channel MOS transistor 155 and an N-channel MOS transistor 161 are coupled (a drain of one of the transistors and a source of the other one of the transistors are connected to form a terminal T5, and a source of that one of the transistors and a drain of that the other one of the transistors are connected to form a terminal U5). A P-channel MOS transistor 156 and an N-channel MOS transistor 162 are coupled (a drain of one of the transistors and a source of the other one of the transistors are connected to form a terminal T6, and a source of that one of the transistors and a drain of that the other one of the transistors are connected to form a terminal U6). T1, T2, and T3 are connected to VID (R/G/B). Respective gates of the transistors 157 to 159 are connected to OBS1 (one of outputs of the data buffer circuit BuS). Respective gates of the transistors 151 to 153 are connected to OBS2 (the other one of the outputs of the data buffer circuit BuS). T4, T5, and T6 are connected to PVID. Respective gates of the transistors 160 to 162 are connected to OBP1 (one of outputs of the precharge buffer circuit BuP). Respective gates of the transistors 154 to 156 are connected to OBP2 (the other one of the outputs of the precharge buffer circuit BuP). U1 to U6 are connected to the output line S (R/G/B). In the case shown in FIG. 23(a), three VID (R/G/B) correspond to three output lines S (R/G/B). In the case shown in FIG. 23(b), one VID corresponds to one output line S. The foregoing is merely an exemplary case in which the number of transistors that open and close simultaneously by the respective signals OBS1, OBS2, OBP1, and OBP2 increases and decreases according to the number of output lines, and the present invention is not limited to the case. For example, the number of VID (R1/G1/B1/ . . . /Rn/Gn/Bn) corresponding to 3n (n is an integer of 2 or greater) lines of the output line S (R1/G1/B1/ . . . /Rn/Gn/Bn) may be increased to 3n so that the number of transistors that are opened and closed simultaneously by the respective signals OBS1, OBS2, OBP1, and OBP2 becomes 3n.

Figure 24:
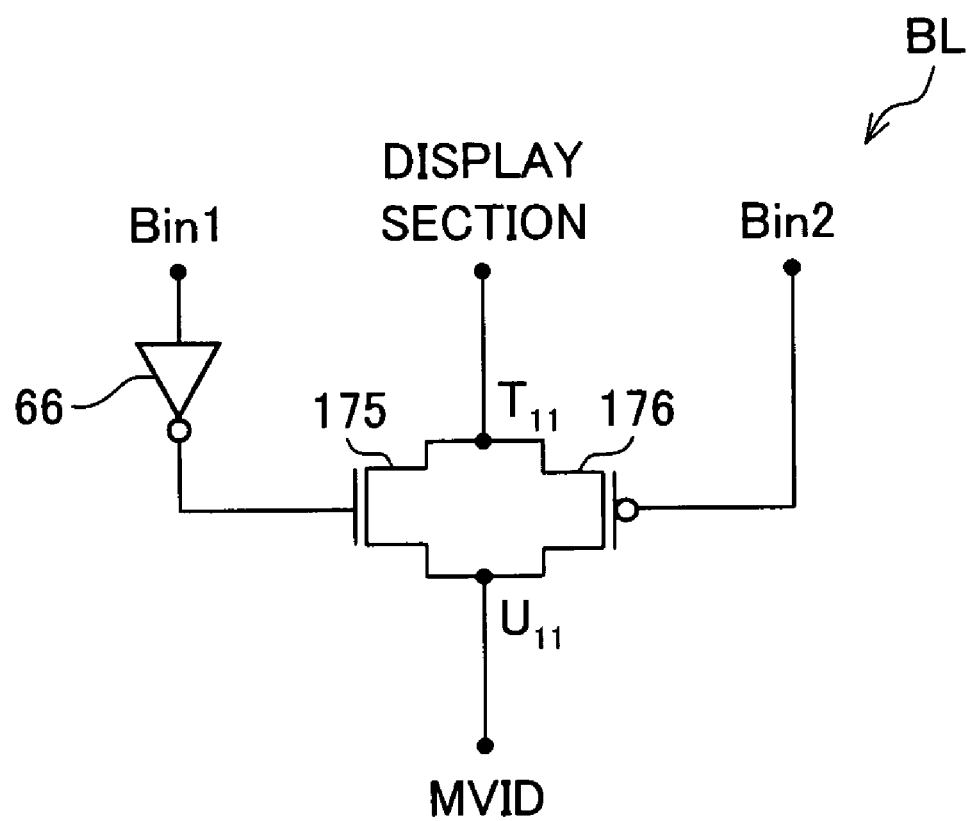
Figure 25:
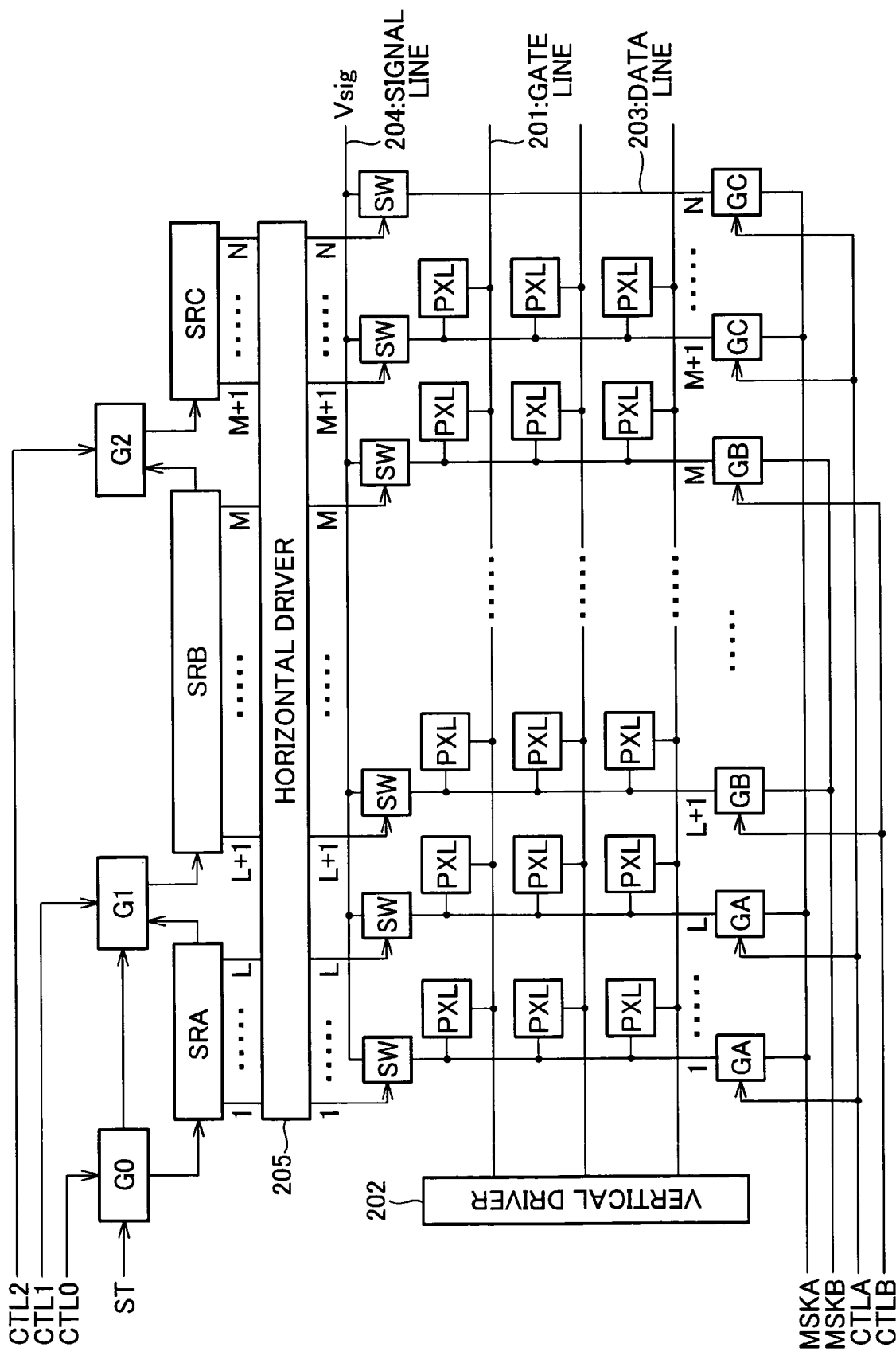

An exemplary configuration of the mask switch circuit BL is as shown in FIG. 24. A P-channel MOS transistor 176 and an N-channel MOS transistor 175 are coupled (a drain of one of the transistors and a source of the other one of the transistors are connected to form a terminal T11, a source of that one of the transistors and a drain of that the other one of the transistors are connected to form a terminal U11). An input Bin1 is connected to a gate of the transistor 175 via an inverter 66. An input Bin2 is connected to a gate of the transistor 176. T11 is connected to the display section. U11 is connected to L4 (MVID). In the mask switch circuit BL that corresponds to the wide-display sections 5a and 5b and the dummy pixel sections 7a and 7b, Bin1 and Bin2 are connected to L5 (ASPE). In the mask switch circuit BL that corresponds to the normal-display section 6, Bin1 and Bin2 are connected to VDD. The mask switch circuit BL is connected to respective data lines.

A shift-register stage Sri, a delay circuit Dli, a buffer circuit Bui, and a sampling circuit SMi are connected in this order, and the sampling circuit Smi is connected to an output line Si (i is an integer in the range of 1 to 307). In this manner, a shift-register stage SRd3, a delay circuit DLd3, a buffer circuit Bud3, a sampling circuit SMd3, and an output line Sd3 are connected. A shift-register stage SRd4, a delay circuit DLd4, a buffer circuit Bud4, a sampling circuit SMd4, and an output line Sd4 are connected in the same manner.

Two wide-display sections 5a and 5b are each provided at respective sides of the normal-display section 6, which is provided at a central part of the screen, so as to sandwich the normal-display section 6. Two dummy pixel sections 7a and 7b are provided so as to sandwich the wide-display sections 5a and 5b and the normal-display section 6.

The sampling circuit SMd3 is connected to the dummy pixel section 7a via the output line Sd3. The sampling circuits SM1 to SM38 are connected to the wide-display section 5a via the output lines S1 to S38, respectively. The sampling circuits SM39 to SM269 are connected to the normal-display section 6 via the output lines S39 to S269, respectively. The sampling circuits SM270 to SM307 are connected to the wide-display section 5b via the output lines S270 to S307, respectively. The sampling circuit SMd4 is connected to the dummy pixel section 7b via the output line Sd4. The mask switch circuit BLd3 is connected to the dummy pixel section 7a. The mask switch circuits BL1 to BL38 are connected to the wide-display section 5a. The mask switch circuits BL39 to BL269 are connected to the normal-display section 6. The mask switch circuits BL270 to BL307 are connected to the wide-display section 5b. The mask switch circuit BLd4 is connected to the dummy pixel section 7b.

The shift register 2 is configured for double pulses. With the shift register 2, shifting in two directions is possible. Further, the shift register 2 performs shifting operation to divide the shift register by three in partial-screen display (only the normal-display section 6 shows a display). Specifically, in partial-screen display, if the shifting is rightward (see the arrows in FIG. 4), the shift register circuits SR37 to SR272 operate while neither of the shift register circuits SRd1 to SR36 and the shift register circuits SR273 to SRd6 operate. If the shifting is leftward (see the arrows in FIG. 4), only the shift register circuits SR271 to SR36 operate. On the other hand, in wide display (the wide-display section 5 as well as the normal-display section 6 show a display), the shift register circuits SRd2 to SRd6 operate if the shifting is rightward, whereas the shift register circuits SRd5 to SRd1 operate if the shifting is leftward.

The following describes a configuration and operation of the respective shift register circuits.

Figure 1:
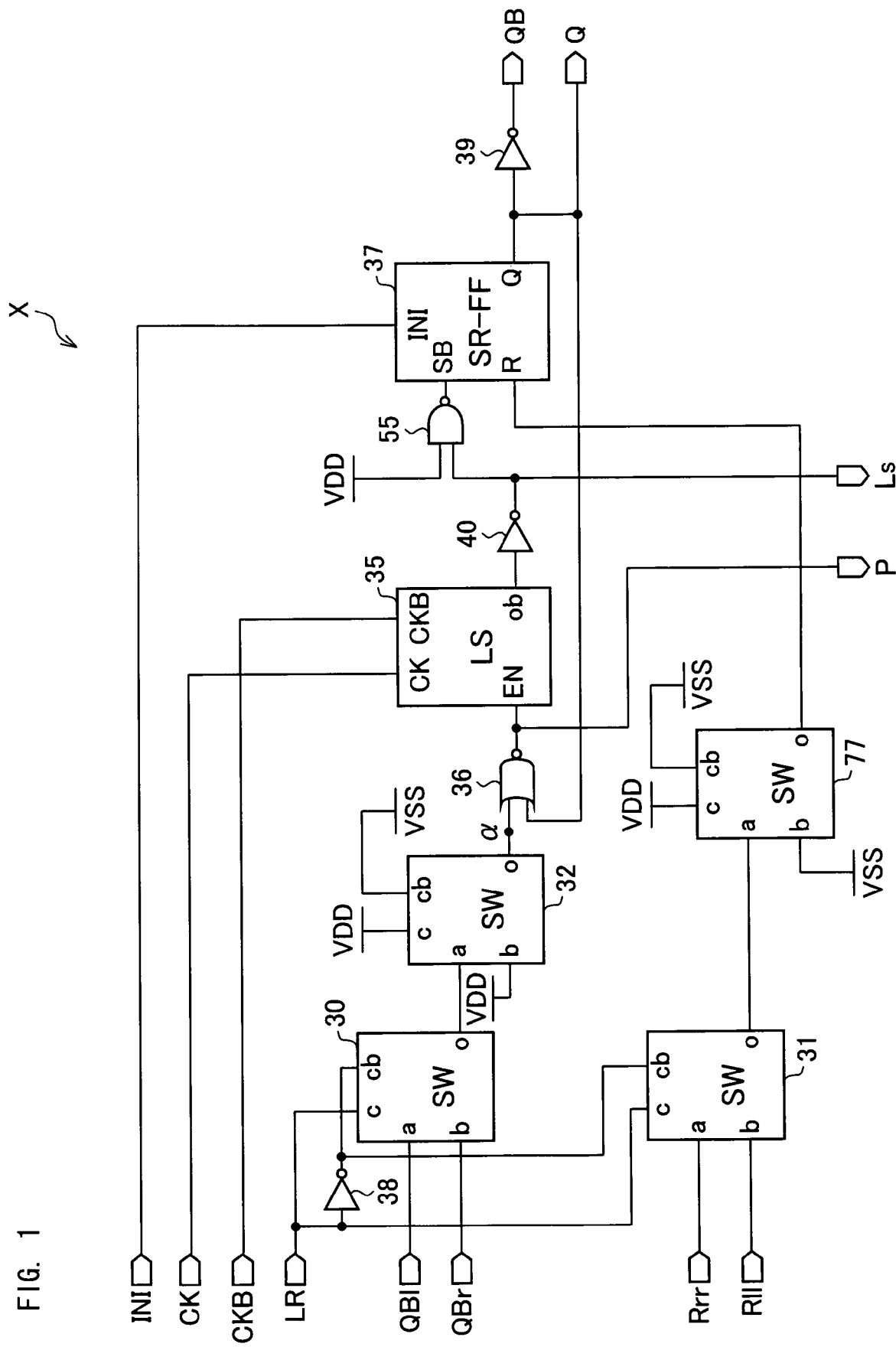
FIG. 1
This is a circuit diagram showing a partial configuration of a shift register (shift register circuit) in accordance with the present embodiment.

FIG. 1 shows a configuration of the shift register circuits SRd1, SRd3, SR1 to SR35, SR38 to SR270, SR273 to 307, SRd4, and SRd6 (those shift register circuits will be referred to as a shift register circuit X hereinafter). As shown in this figure, the shift register circuit X includes a switch 30, a switch 31, a switch 32, a switch 77, a level shifter 35, a NOR 36, a NAND 55, a set-reset flip-flop (SR-FF hereinafter) 37, and three inverters 38, 39, 40. The shift register circuit X has eight input ends (CK, CKB, LR, INI, QBr, QBl, Rrr, Rll) and four output ends (QB, P, Ls, Q). The switches (30 to 32, 77) each have an input-a, an input-b, an input-c, an input-cb and an output-o. The level shifter 35 is connected to the input ends CK and CKB, and has an input EN and an output-ob. The SR-FF 37 is connected to the input end INI, and has an input SB (set bar) and the reset R. An output of the SR-FF 37 is connected to the output end Q (of the shift register circuit X). The NOR 36 has two inputs. The inverters (38 to 40) each amplify a signal of positive logic to tap off a signal of negative logic as an output.

The input-a of the switch 30 is connected to the input end QBl. The input-b of the switch 30 is connected to the input end QBr. The input-c of the switch 30 is connected to the input end LR. The input-cb of the switch 30 is connected to an output of the inverter 38. An input of the inverter 38 is connected to LR. The input-a of the switch 31 is connected to Rrr. The input-b of the switch 31 is connected to Rll. The input-c of the switch 31 is connected to the input end LR. The input-cb of the switch 31 is connected to an output of the inverter 38. The input-a of the switch 32 is connected to the output-o of the switch 30. The input-b of the switch 32 is connected to VDD. The input-c of the switch 32 is connected to VDD. The input-cb of the switch 32 is connected to VSS. The input-a of the switch 77 is connected to the output-o of the switch 31. The input-b of the switch 77 is connected to Vss. The input-c of the switch 77 is connected to VDD. The input-cb of the switch 77 is connected to VSS. The NOR 36 is fed with an output of the switch 32 and an output of the SR-FF 37. An output of the NOR 36 is connected to the input EN of the level shifter. The output-ob of the level shifter is connected to an input of the inverter 40. An output of the inverter 40 is connected to one of inputs of the NAND 55. The other one of the inputs of the NAND 55 is connected to VDD. An output of the NAND 55 is connected to the input SB (set bar) of the SR-FF 37. The reset R of the SR-FF 37 is connected to the output-o of the switch 77. An output of the SR-FF 37 is connected to an input of the inverter 39 and to the output end Q of the shift register circuit X. Regarding other ends (ends other than the output end Q) of the shift register circuit X, QB is connected to an output of the inverter 39, Ls is connected to an output of the inverter 40, and P is connected to an output of the NOR 36.

Figure 5A:
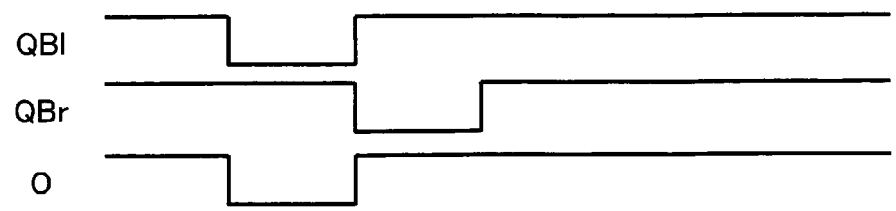
FIG. 5(a)
This is a timing diagram showing operation of the shift register circuit shown in FIG. 1.
Figure 5B:
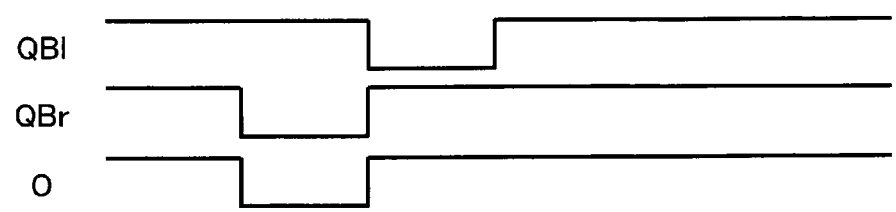
FIG. 5(b)
This is a timing diagram showing operation of the shift register circuit shown in FIG. 1.

Operation of the switch 30 is as shown in FIGS. 5(a) and 5(b). If the input end LR of the shift register circuit X is "H (High)", a signal of the input end QBl connected to the input-a is tapped off without being changed (see FIG. 5(a)). On the other hand, if the input end LR is "L (Low)", a signal of the input end QBr connected to the input-b is tapped off without being changed (see FIG. 5(b)).

Figure 5C:
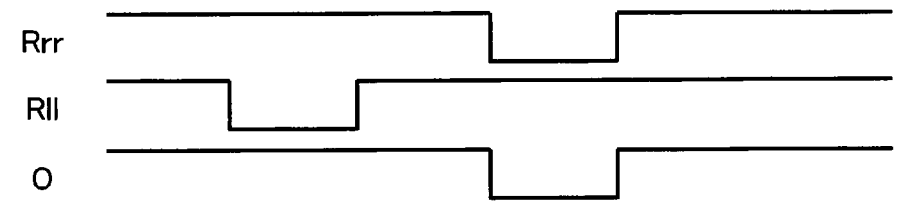
FIG. 5(c)
This is a timing diagram showing operation of the shift register circuit shown in FIG. 1.
Figure 5D:
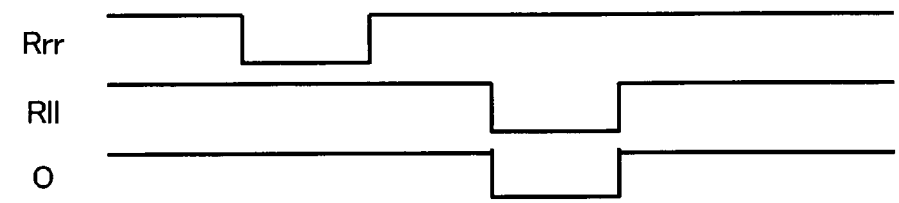
FIG. 5(d)
This is a timing diagram showing operation of the shift register circuit shown in FIG. 1.

Operation of the switch 31 is as shown in FIGS. 5(c) and 5(d). Specifically, if the input end LR of the shift register circuit X is "H", a signal of the input end Rrr connected to the input-a is tapped off without being changed (see FIG. 5(c)). On the other hand, if the input end LR is "L", a signal of the input end Rll connected to the input-b is tapped off without being changed (see FIG. 5(d)). With regard to the switch 32 and the switch 77, input signals (pulse) of the respective inputs-a are always tapped off from the respective outputs-o without being changed (always ON). With regard to the SR-FF 37, "H" is tapped off if "L" is fed into the input SB, and "L" is tapped off if "H" is fed into the reset R.

Figure 5E:
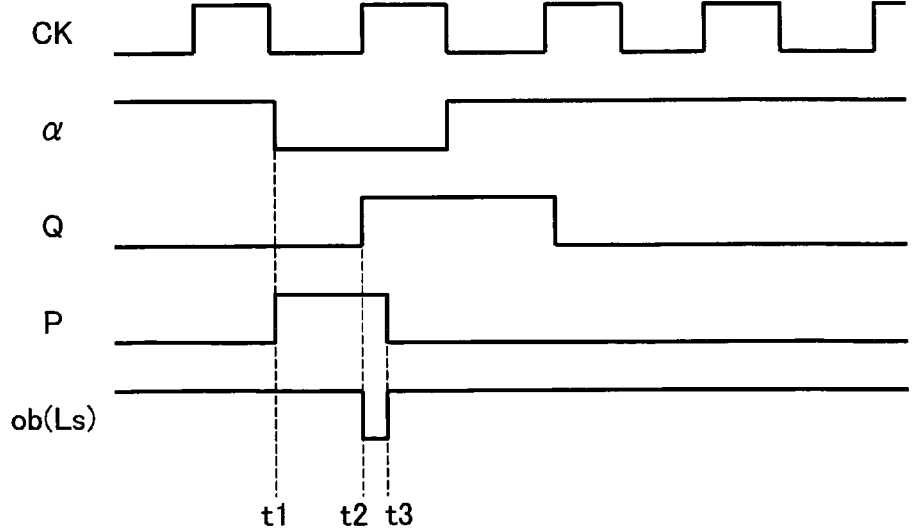
FIG. 5(e)
This is a timing diagram showing operation of the shift register circuit shown in FIG. 1.

Operations of the NOR 36 and the level shifter 35 are as shown in FIG. 5(e). Specifically, if the output-o (node α) of the switch 32 becomes "L (active)" at t1, the output of the NOR 36 (the output end P of the shift register circuit X and the input EN of the level shifter) becomes "H (active)". Accordingly, CKB is tapped off from the level shifter 35. Thus, if CKB becomes "L" at t2, the output-ob of the level shifter 35 becomes "L (active)", and "L" is fed into the input SB of the SR-FF 37. Therefore, the output (output end Q) becomes "H (active)". Because the output end Q is "H" (input of NOR 36), the output of the NOR 36 (the output end P of the shift register circuit X and the input EN of the level shifter 35) becomes "L (inactive)" at t3, which is delayed from t2. Thus, the output-ob of the level shifter 35 becomes "H (inactive)".

Omission of the switch 31, the switch 77, and the NAND 55 does not affect the operation of the shift register circuit X, but the switch 31, the switch 77, and the NAND 55 are provided as a load adjusting circuit to make the shift register circuits (X, W, Y, Z) uniform in configuration, whereby loads of the shift register circuits are equalized so that pulse delays of the shift registers are equalized. Making the stages uniform in configuration in the shift register equalizes the signal loads of the stages. This significantly reduces lags (phase shift) in signal delays among the stages. Thus, signal defects resulting from the lags in signal delays among the stages are restrained, which realizes high-quality displays on the display device 1.

FIG. 6 shows a configuration of the shift register circuits SR36 and SR272 (the shift register circuits will be referred to as a shift register circuit W hereinafter). As shown in this figure, the shift register circuit W is constituted by the same components as those of the shift register circuit X. Specifically, the shift register circuit W is constituted by the switch 30, the switch 31, the switch 32, the switch 77, the level shifter 35, the NOR 36, the NAND 55, the set-reset flip-flop (the set-reset flip-flop will be referred to as an SR-FF hereinafter) 37, and three inverters 38, 39, 40. The shift register-circuit W has nine input ends (NR/NL, CK, CKB, LR, INI, QBr, QBl, Rrr, Rll) and four output ends (QB, P, Ls, Q). SR36 has the input end NR, and SR272 has the input end NL.

The switches (30 to 32, 77) each have the input-a, the input-b, the input-c, the input-cb and the output-o. The level shifter 35 is connected to the input ends CK, CKB, and has the input EN and the output-ob. The SR-FF 37 is connected to the input end INI, and has the input SB (set bar) and the reset R. The output of the SR-FF 37 is connected the output end Q (of the shift register circuit W).

Figure 7A:
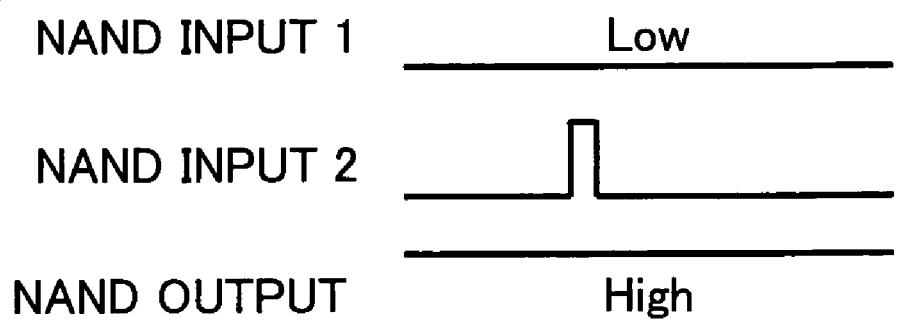
FIG. 7(a)
This is a timing diagram showing operation of the shift register circuit shown in FIG. 6.
Figure 7B:
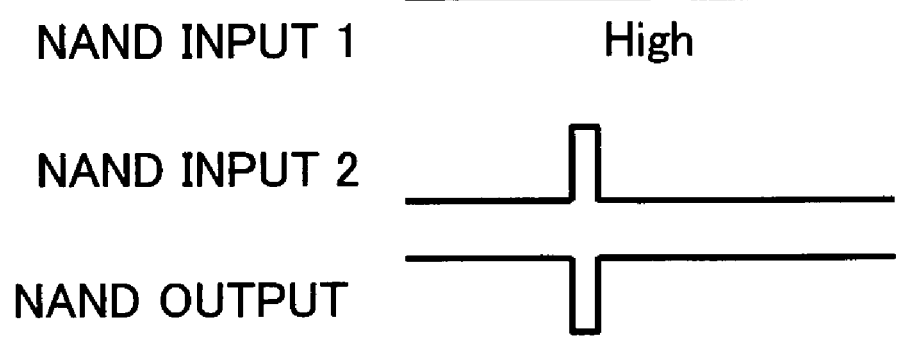
FIG. 7(b)

The components of the shift register circuit W are connected and operate in the same manner as in the shift register circuit X, except for the NAND 55. Specifically, one of the inputs of the NAND 55 is connected to either NR or NL. This allows the shift register W to interrupt a set signal to the SR-FF 37 by the NAND 55 in partial-screen display. If NL is "H", the set signal to the SR-FF 37 of the shift register circuit SR272 is interrupted so that the shifting to the shift register circuit SR373 and thereafter stops. If NR is "H", the set signal to the SR-FF 37 of the shift register circuit SR36 is interrupted so that the shifting to the shift register circuit SR36 and thereafter stops. Those are shown in FIGS. 7(a) and 7(b). Specifically, in the case of leftward shifting in partial-screen display, the shift register circuit SR36 operates in the manner as shown in FIG. 7(a) to perform the interrupting, and the shift register circuit SR272 operates in the manner as shown in FIG. 7(b) to perform the setting. On the other hand, in the case of rightward shifting in partial-screen display, the shift register circuit SR36 operates in the manner as shown in FIG. 7(b) to perform the setting, and the shift register circuit SR272 operates in the manner as shown in FIG. 7(a) to perform the interrupting.

Omission of the switch 32 and the switch 77 does not affect the operation of the shift register circuit W, but the switch 32 and the switch 77 are provided as the load adjusting circuit to make the shift register circuits (X, W, Y, Z) uniform in configuration, whereby loads of the shift register circuits are equalized so that pulse delays of the shift registers are equalized. Making the stages uniform in configuration in the shift register equalizes the signal loads of the stages. This significantly reduces lags (phase shift) in signal delays among the stages. Thus, signal defects resulting from the lags in signal delays among the stages are restrained, which realizes high-quality displays on the display device 1.

FIG. 8 shows configurations of the respective shift register circuits SR37 and SR271 (the shift register circuits will be referred to as a shift register circuit Y hereinafter). As shown in this figure, the shift register circuit Y is constituted by the same components as those of the shift register circuit X. Specifically, the shift register circuit Y is constituted by the switch 30, the switch 31, the switch 32, the switch 77, the level shifter 35, the NOR 36, the NAND 55, the set-reset flip-flop (the set-reset flip-flop will be referred to as an SR-FF hereinafter) 37, and three inverters 38, 39, 40. The shift register circuit Y has 12 input ends (NL/NR, CK, CKB, LR, SSPB, INI, QBr, QBl, Rrr, Rll) and four output ends (QB, P, Ls, Q). SR37 has the input end NL, and SR271 has the input end NR.

The switches (30 to 32) each have the input-a, the input-b, the input-c, the input-cb and the output-o. The level shifter 35 is connected to the input ends CK, CKB, and has the input EN and the output-ob. The SR-FF 37 is connected to the input end INI, and has the input SB (set bar) and the reset R. The output of the SR-FF 37 is connected to the output end Q (of the shift register circuit Y).

The components of the shift register circuit Y are connected and operate in the same manner as in the shift register circuit X, except for the switch 32 and the switch 77. Specifically, the input-b of the switch 32 of the shift register circuit Y is connected to the input end SSPB of the shift register circuit Y. The input end NL (SR37)/NR (SR271) of the shift register circuit Y is connected to the input-cb of the switch 32. The input end NL (SR37)/NR (SR271) is also connected to the input-c (of the switch 32) via an inverter. The input-b of the switch 77 of the shift register circuit Y is connected to the input end Rl (SR37)/Rr (SR271) of the shift register circuit Y. The input end NR (SR37)/NL (SR271) of the shift register circuit Y is connected to the input-cb of the switch 77. The input end NR (SR37)/NL (SR271) is also connected to the input-c (of the switch 77) via an inverter.

In the shift register circuit Y in partial-screen display (when ASPE is "L"), a start pulse (SSPB) fed into an in-between stage (SR37, SR271) of the shift register 1 is transmitted to the NOR 36, the level shifter 35, and the SR-FF 37 by the switch 32 so that shifting operation is started between a first stage and a last stage of the shift register. Further, in partial-screen display (when ASPE is "L"), an Ls signal of the following stage (scanning direction), which Ls signal has been fed into Rl/Rr, is transmitted to R (reset) of the SR-FF by the switch 77 so that the shifting is forced to stop the shifting operation between the first stage and the last stage of the shift register.

Figure 9A:
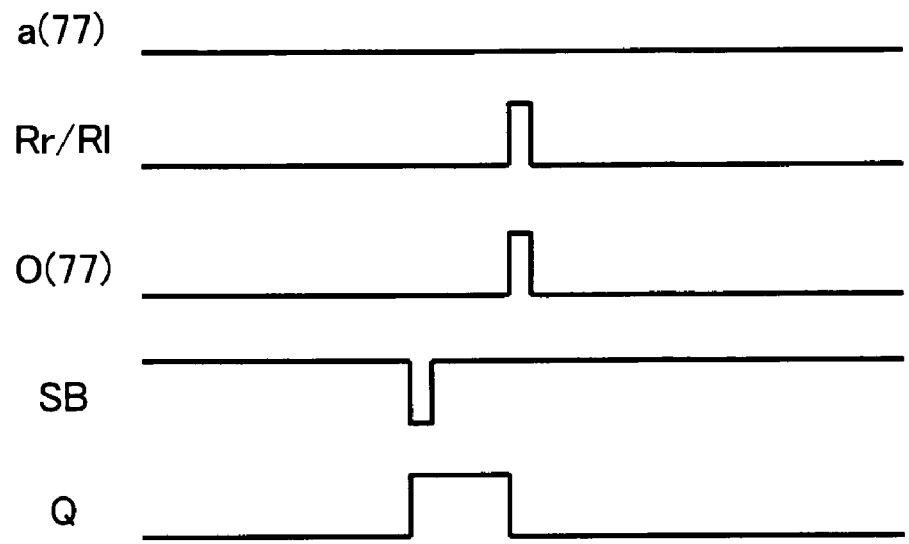
Figure 9B:
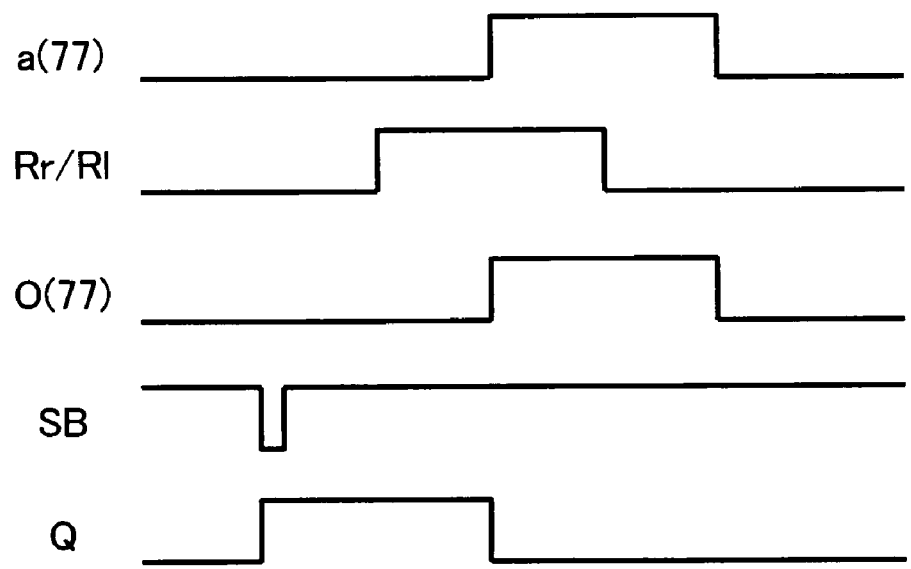

FIGS. 9(*a*) and 9(*b*) each show the operation of the switch 77 in the shift register circuit Y. Note that a(77) is the input-a of the switch 77, and O(77) is the output-o of the switch 77. In the case of rightward shifting in partial-screen display, the shift register circuit SR37 performs normal operation (b), and the shift register circuit SR271 performs operation (a) for stopping. In the case of leftward shifting in partial-screen display, the shift register circuit SR37 performs operation (a) for stopping, and the shift register circuit SR271 performs normal operation (b).

Figure 10A:
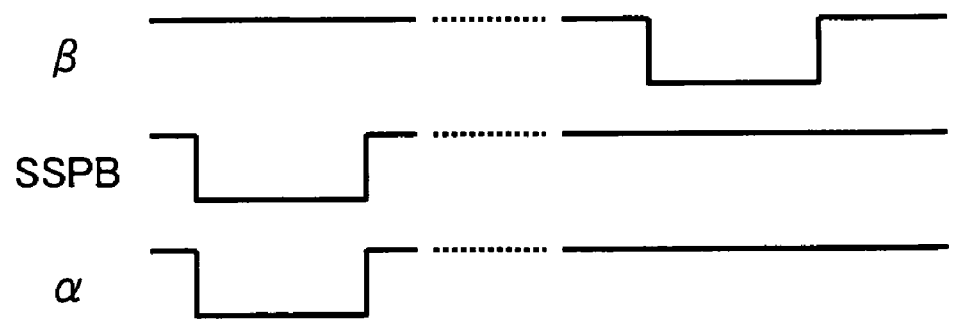
Figure 10B:
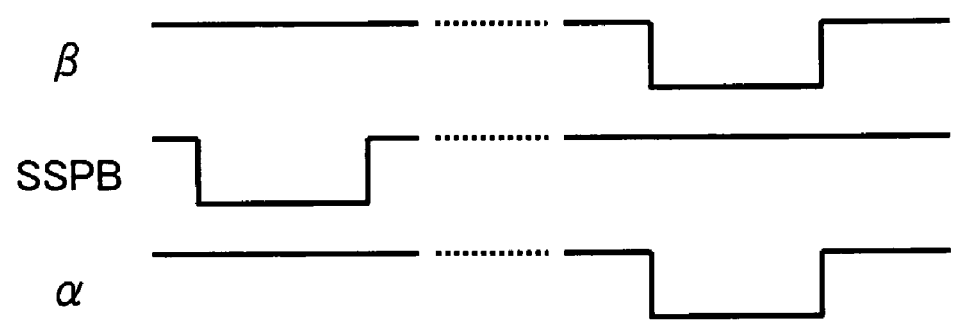

Operation of the switch 32 in the shift register circuit Y is as shown in FIGS. 10(*a*) and 10(*b*). If ASPE is "L" and NL is "H" (in the case of rightward shifting in partial-screen display), SSPB is fed into the node α (output of the switch 32) of SR271 without being changed, as shown in FIG. 10(*a*). If ASPE is "L" and NR is "H" (in the case of leftward shifting in partial-screen display), SSPB is fed into the node α of SR37 (output of the switch 32) without being changed. On the other hand, if ASPE is "H" (wide display), NR and NL both become "L". At this time, SSPB is interrupted at both SR37 and SR271 so that, as shown in FIG. 10(*b*), a signal of the node β (output-o of the switch 30) is tapped off to the node α (output-o of the switch 32) without being changed (this operation is same as that of the switch 32 of the shift register circuit X).

Omission of the NAND 55 does not affect the operation of the shift register circuit Y, but the NAND 55 is provided as the load adjusting circuit to make the shift register circuits (X, W, Y, Z) uniform in configuration, whereby loads of the shift register circuits are equalized so that pulse delays of the shift registers are equalized. Making the stages uniform in configuration in the shift register equalizes the signal loads of the stages. This significantly reduces lags (phase shift) in signal delays among the stages. Thus, signal defects resulting from the lags in signal delays among the stages are restrained, which realizes high-quality displays on the display device 1.

FIG. 11 shows a configuration of the shift register circuits SRd2 and SRd5 (the shift register circuits will be referred to as a shift register circuit Z hereinafter). As shown in this figure, the components of the shift register circuit Z are same as those of the shift register circuit X. Specifically, the shift register circuit Z is constituted by the switch 30, the switch 31, the switch 32, the switch 77, the level shifter 35, the NOR 36, the NAND 55, the set-reset flip-flop (the set-reset flip-flop will be referred to as an SR-FF hereinafter) 37, and three inverters 38, 39, 40. The shift register circuit Z has 10 input ends (WL/WR, CK, CKB, LR, SSPB, INI, QBr, QBl, Rrr, Rll) and two output ends (QB, Ls) (this stage does not need pulses for sampling the precharge PVID or the video signals VID, so that the output terminals P and Q are omitted, but in order to equalize the loads more precisely, the output terminals P and Q may be provided in the same manner as the other shift register circuits, and the delay circuit 4 may be connected as a dummy load in the same manner as the other stages). SRd2 has the input end WL, and SRd5 has the input end WR. The switches (30 to 32) each have the input-a, the input-b, the input-c, the input-cb and the output-o. The level shifter is connected to the input ends CK, CKB, and has the input EN and the output-ob. The SR-FF 37 is connected to the input end INI, and has the input SB (set bar) and the reset R. The output of the SR-FF 37 is fed into the inverter 39 and the NOR 36.

The components of the shift register circuit Z are connected and operate in the same manner as in the shift register circuit X, except for the switch 32. Specifically, the input-b of the switch 32 of the shift register circuit Z is connected to the input end SSPB of the shift register circuit Z. The input end WL (in the case of SRd2)/WR (in the case of SRd5) of the shift register circuit Z is connected to the input-cb of the switch 32. The input end WL (in the case of SRd2)/WR (in the case of SRd5) is also connected to the input-c (of the switch 32) via an inverter. In the shift register circuit Z in wide display (when ASPE is "H"), a start pulse (SSPB) having been fed into a dummy stage (SRd2, SRd5) of the shift register 1 is transmitted to the NOR 36, the level shifter 35, and the SR-FF 37 by the switch 32 to start the shifting from an end of the shift register.

Figure 12A:
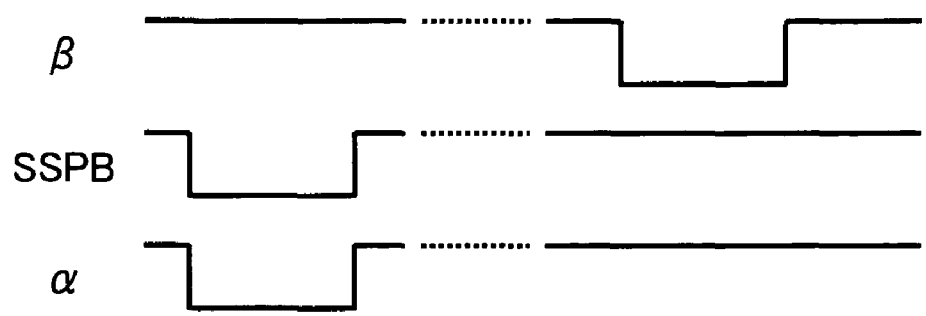
Figure 12B:
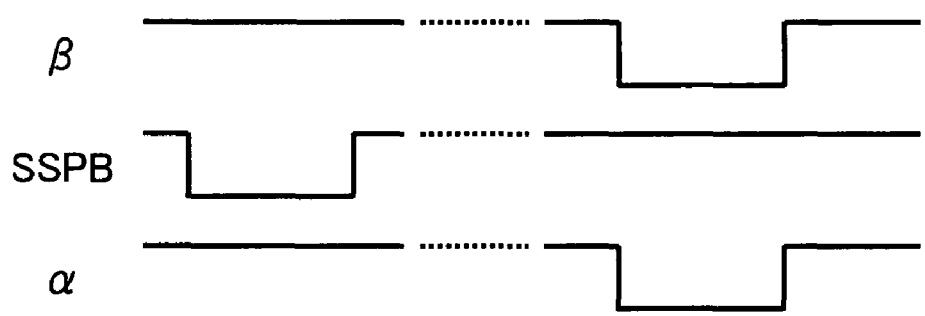

Operation of the switch 32 in the shift register circuit Z is as shown in FIGS. 12(*a*) and 12(*b*). If ASPE and WL are both "H" (in the case of rightward shifting in wide display), SSPB is fed into the node α (output of the switch 32) of SRd2 without being changed, as shown in FIG. 12(*a*). If ASPE and WR are both "H" (in the case of leftward shifting in wide display), SSPB is fed into the node α (output of the switch 32) of SRd5 without being changed, as shown in FIG. 12(*a*). If ASPE is "L" (partial-screen display), WR and WL both become "L". At this time, SSPB is interrupted at both SRd2 and SRd5 so that, as shown in FIG. 12(*b*), a signal of the node β (output-o of the switch 30) is tapped off to the node α (output-o of the switch 32) without being changed (this is the same operation as that of the switch 32 of the shift register circuit X).

Omission of the switch 77 and the NAND 55 does not affect the operation of the shift register circuit Z, but the switch 77 and the NAND 55 are provided as the load adjusting circuit to make the shift register circuits (X, W, Y, Z) uniform in configuration, whereby loads of the shift register circuits are equalized so that pulse delays of the shift registers are equalized. Making the stages uniform in configuration in the shift register equalizes the signal loads of the stages. This significantly reduces lags (phase shift) in signal delays among the stages. Thus, signal defects resulting from the lags in signal delays among the stages are restrained, which realizes high-quality displays on the display device 1.

The following describes how the shift register circuits are connected in the shift register 2 (see FIGS. 2 and 3).

For example, the shift register circuits SR37 and 38 are respectively connected as follows. Regarding SR37, QBl is connected to QB of SR36, QBr is connected to QB of SR38, Rrr is connected to Ls of SR39, Rll is connected to Ls of SR35, QB is connected to QBr of SR36 and QBl of SR38, P is connected to the precharge delay circuit DLP37, Ls is connected to Rrr of SR35 and Rll of SR39, and Q is connected to the data delay circuit DLS37. Regarding SR38, QBl is connected to QB of SR37, QBr is connected to QB of SR39, Rrr is connected to Ls of SR40, Rll is connected to Ls of SR36, QB is connected to QBr of SR37 and QBl of SR39, P is connected to the precharge delay circuit DLP38, Ls is connected to Rrr of SR36 and Rll of SR40, and Q is connected to the data delay circuit DLS38.

Accordingly, the respective shift register circuits SRn (n is in the range of 1 to 307) shown in FIGS. 2 and 3 are connected as follows: QBl is connected to QB of SRn−1 (shift register circuit on the left); QBr is connected to QB of SRn+1 (shift register circuit on the right); Rrr is connected to Ls of SRn+2 (shift register circuit next on the right but one); Rll is connected to Ls of SRn−2 (shift register circuit next on the left but one); QB is connected to QBr of SRn−1 (shift register circuit on the left) and QBl of SRn+1 (shift register circuit on the right); P is connected to the precharge delay circuit DLPn; Ls is connected to Rrr of SRn−2 (shift register circuit next on the left but one) and Rll of SRn+2 (shift register circuit next on the right but one); and Q is connected to the data delay circuit DLSn. The same applies to the shift register circuits SRd3 and SRd4.

Further, Rl of SR37 is connected to Ls of SR36, and Rr of SR271 is connected to Ls of SR272. To equalize the loads more precisely, Ls of SR36 (SR272) may be connected to Rl (Rr) of SR37 (SR271), and a load that is equal to the load from Ls of SR36 to the transistor of SW77, to which that Rl (Rr) is connected, of SR 37 may be added to Ls of other stage.

Regarding SRd1, QBl is connected to VDD, QBr is connected to QB of SRd2, Rrr is connected to Ls of SRd3, Rll is connected to an output of an inverter IN1, QB is connected to QBl of SRd2, and Ls is connected to Rll of SRd2, Rll of SRd3, and an input of an inverter 2, which is connected serially to the inverter IN1. Regarding SRd2, QBl is connected to QB of SRd1, QBr is connected to QB of SRd3, Rrr is connected to Ls of SR1, Rll is connected to an input of the inverter IN2, QB is connected to QBr of SRd1 and QBl of SRd3, and Ls is connected to Rll of SR1.

Regarding SRd5, QBl is connected to QB of SRd4, QBr is connected to QB of SRd6, Rrr is connected to Rrr of SRd4 and Ls of SRd6, Rll is connected to Ls of SR307, QB is connected to QBr of SRd4 and QBl of SRd6, and Ls is connected to Rrr of SR307. Regarding SRd6, QBl is connected to QB of SRd5, QBr is connected to VDD, Rrr is connected to an output of an inverter IN4, which is connected serially to an inverter IN3, Rll is connected to Ls of SRd4, QB is connected to QBr of SRd5, Ls is connected to Rrr of SRd4, Rrr of SRd5, and an input of the inverter IN3.

The following describes the delay circuit section 4, the buffer circuit section 3, and the sampling circuit section 8 (see FIGS. 2 to 4). The delay circuits DL (DLd3, DL1 to DL307, and DLd4 (in the order as provided, starting at an end)) each include a precharge delay circuit DLP and a data delay circuit DLS. Specifically, a delay circuit Dli (i is an integer in the range of 1 to 307) includes a precharge delay circuit DLPi and a data delay circuit DLSi. A delay circuit DLd3 includes a precharge delay circuit DLPd3 and a data delay circuit DLSd3. The same applies to a delay circuit DLd4. The buffer circuits Bu each include a precharge buffer circuit BuP and a data buffer circuit BuS. Specifically, a buffer circuit Bui (i is an integer in the range of 1 to 307) includes a precharge buffer circuit BuPi and a data buffer circuit BuSi. A buffer circuit Bud3 includes a precharge buffer circuit BuPd3 and a data buffer circuit BuSd3. The same applies to a buffer circuit Bud4.

The precharge delay circuit DLP is connected to the sampling circuit SM via the precharge buffer circuit BuP. The data delay circuit DLS is connected to the sampling circuit SM via the data buffer circuit BuS. Specifically, a precharge delay circuit DLPi (i is an integer in the range of 1 to 307) is connected to a sampling circuit SMi via the precharge buffer circuit BuPi. A data delay circuit DLSi (i is an integer in the range of 1 to 307) is connected to the sampling circuit Smi via a data buffer circuit BuSi. A precharge delay circuit DLPd3 is connected to a sampling circuit SMd3 via a precharge buffer circuit BuPd3. A data delay circuit DLSd3 is connected to the sampling circuit SMd3 via a data buffer circuit BuSd3. The same applies to a precharge delay circuit DLPd4 and a data delay circuit DLSd4.

The sampling circuits SM (SMd3, SM1 to SM307, and SMd4, which are listed in the order as provided, starting at an end) are connected to the output lines (Sd3, S1 to S307, Sd4), respectively. Specifically, a sampling circuit Smi (i is an integer in the range of 1 to 307) is connected to an output line Si. The same applies to the sampling circuits SMd3 and SMd4. The sampling circuits SMd3 and SMd4 are connected to output lines Sd3 and Sd4, respectively. The respective sampling circuits SM are connected to the precharge line L2 and the video line L3. The precharge signal (electric potential) PVID is transmitted to the precharge line L2, and the video signal (electric potential) VID is transmitted to the video line L3. The respective sampling circuits SM connect the output line S and the precharge line L2 in response to a signal from the precharge buffer circuit BuP, and connect the output line S and the video line L3 in response to a signal from the data buffer circuit BuS. With the foregoing arrangement, precharging and writing on video data are performed on the respective output lines (Sd3, S1 to S307, Sd4).

The following describes the respective mask switch circuits shown in FIG. 4. The respective mask switch circuits (BLd3, BL1 to 307, and BLd4) are analog switches. The mask switch circuits (BLd3, BL1 to 38, BL270 to 307, and BLd4) corresponding to the wide-display sections 5a, 5b and the dummy pixel section 7a, 7b are connected to both the mask line L4 and the display-mode line L5. The mask switch circuits (BL39 to 269) corresponding to the normal-display section 6 are connected only to the mask line L4. The line L4 is fed with mask signal data MVID. The line L5 is fed with a display mode signal ASPE. In wide display (ASPE is "H"), the mask switch circuits BL are all closed. On the other hand, in partial-screen display (ASPE is "L"), the mask switch circuits connected to the wide-display sections 5a, 5b become ON, and the wide-display sections 5a, 5b and the dummy pixel sections 7a, 7b are fed with the mask signal data MVID via the mask line L4. Although being in an OFF state regardless of whether the display is the wide display or the partial-screen display, the mask switch circuit connected to the normal-display section 6 is connected so that the loads are equalized.

The following describes the operation of the shift register 2, in view of the foregoing description.

Figure 13:
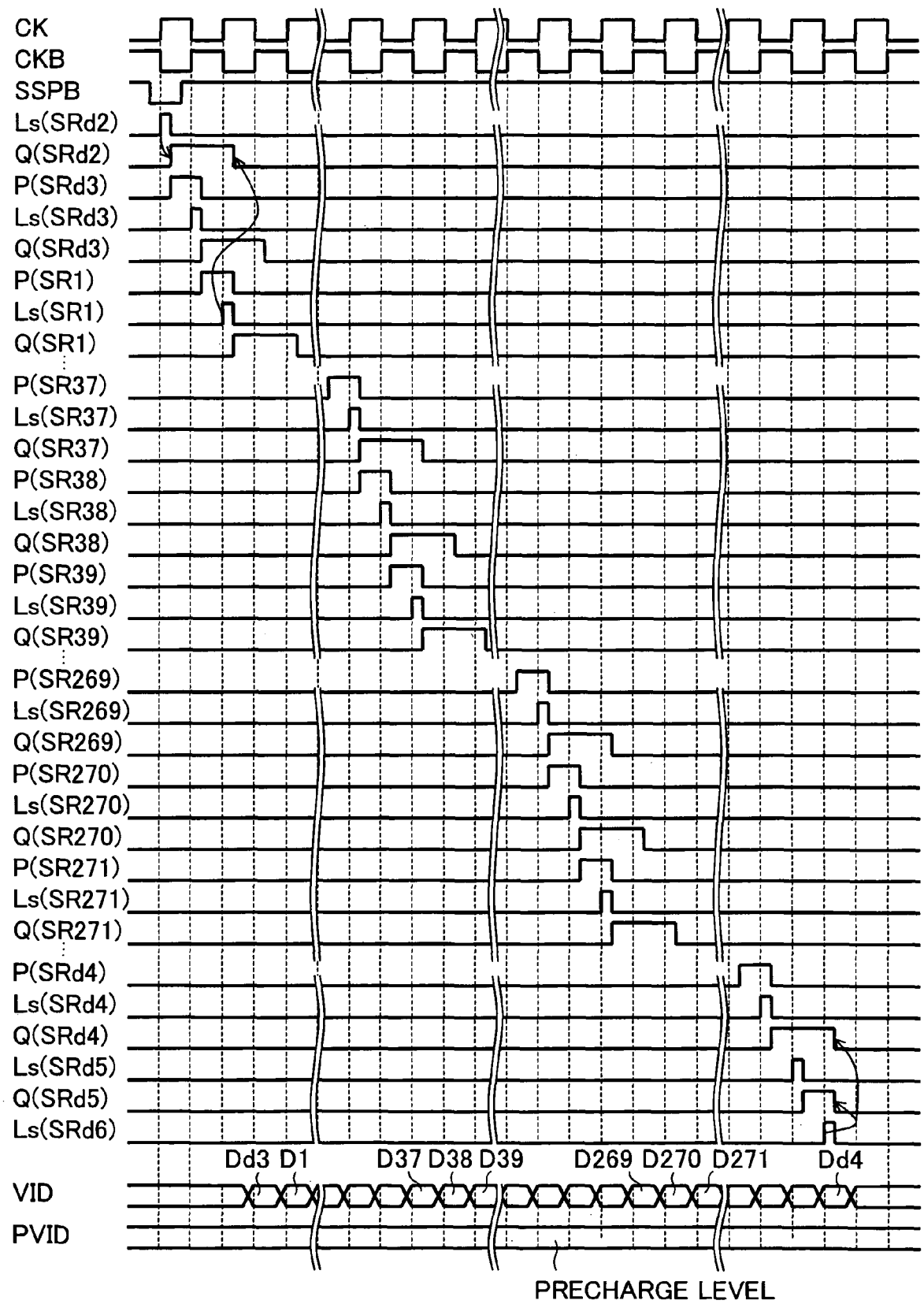

FIG. 13 is a timing diagram showing the operation of the shift register in the case of shifting from left to right in wide display (if ASPE is "H" and LR is "H", then WL is "H").

If SSPB becomes "L (active)", the output of the switch 32 of the shift register circuit SRd2 becomes "L", and the output of the NOR 36 (input EN of the level shifter 35) of the shift register circuit SRd2 becomes "H (active)". Thus, CKB shifted in level is tapped off from the (even-numbered) level shifter 35 of the shift register circuit SRd2. If CKB becomes "L", the output of the level shifter 35 becomes "L", and the output end Ls of the shift register circuit SRd2 becomes "H (active)".

The output "L" of the level shifter 35 of SRd2 is fed into the input SB of the SR-FF of this SRd2. Thus, lagging behind the event that the output end Ls of SRd2 becomes "H (active)", the output (output end Q) of SRd2 becomes "H (active)" (output end QB is "L (active)"). If Q of SRd2 becomes "H", the output of the NOR 36 of SRd2 becomes "L", the output of the level shifter 35 becomes "H", and Ls of SRd2 becomes "L".

QB of SRd2 is connected to QBl of SRd3. Therefore, if QB of SRd2 becomes "L", the output of the switch 32 of SRd3 becomes "L", and the output end P (output of the NOR 36) of the shift register circuit SRd3 becomes "H".

If the output of the NOR 36 of SRd3 becomes "H", CK shifted in level is tapped off from the (odd-numbered) level shifter 35 of SRd3. If CK becomes "L", the output of the level shifter 35 becomes "L", and the output end Ls of the shift register circuit SRd3 becomes "H (active)".

The output "L" of the level shifter 35 of SRd3 is fed into the input SB of the SR-FF of this SRd3. Thus, lagging behind the event that that the output end Ls of SRd3 becomes "H (active)", the output of SRd3 becomes "H (active)", and the output of the NOR 36 of SRd3 (P of SRd3) becomes "L".

Around the time when this P of SRd3 becomes "L", the precharge signal (electric potential) from PVID is sampled at SMd3 and written onto the output Sd3 corresponding to SRd3.

If Ls of the shift register circuit SR1 becomes "H", "H" is fed into the reset R of the SR-FF of SRd2 via the switch 31 of SRd2, because Ls of SR1 is connected to Rrr of SRd2. Specifically, lagging behind the event of "H (active)" of Ls of SR1, the output Q of SRd2 becomes "L (inactive)".

Thereafter, if Ls of the shift register circuit SR2 becomes "H", "H" is fed into the reset R of the SR-FF of SRd3 via the switches 31 and 77 of SRd3, because Ls of SR2 is connected to Rrr of the shift register circuit SRd3. Specifically, lagging behind "H (active)" of Ls of SR2, the output Q of SRd3 becomes "L (inactive)". Around the time when Q of SRd3 becomes "L", the video data Dd3 from VID is sampled at SMd3 and written onto the output Sd3 corresponding to SRd3.

The foregoing shifting is repeated so that the shifting from the shift register circuit SRd2 to the shift register circuit SRd6 are carried out.

FIG. 14 is a timing diagram showing operation of the shift register in the case of shifting from left to right in partial-screen display (if ASPE is "L" and LR is "H", then NL is "H").

When SSPB is fed into the shift register circuit SR37, the shifting starts. Around the time when P of SR39 becomes "L", the precharge signal (electric potential) from PVID is sampled at SM39 and written onto the output S39 corresponding to SR39. Thereafter, around the time when Q of SR39 becomes "L", the video data D39 from VID is sampled at SM39 and written onto the output S39 corresponding to SR39. With the foregoing arrangement, the shifting from the shift register circuit SR37 to the shift register circuit SR272 is carried out. The output Q of the shift register circuit SR270 and Q of SR271 are reset with Ls of the shift register circuit SR272.

FIG. 4 illustrates the arrangement in which the shifting starts at an in-between stage (e.g. SRd37) and ends at an in-between stage (e.g. SR272) in partial-screen display. This, however, is merely an exemplary arrangement of the present embodiment. The present embodiment obviously includes an arrangement in which the shifting starts from a dummy stage (SRd2) and ends at an in-between stage (SR272) and an arrangement in which the shifting starts from an in-between stage (e.g. SR37) and ends at a dummy stage (SRd6), for example.

The present invention is not limited to the description of the embodiments above, but may be altered by a skilled person within the scope of the claims. An embodiment based on a proper combination of technical means disclosed in different embodiments is encompassed in the technical scope of the present invention.

The foregoing embodiment describes the technique in which the sequential precharging is carried out prior to the sampling, but the present invention is not limited by the description in the embodiment. For example, the present concept is applicable to a technique in which all data lines are precharged collectively before the sampling of a display section starts (before a period of horizontal blanking).

INDUSTRIAL APPLICABILITY

A driving circuit (source driver) of a display device in accordance with the present invention is widely applicable to display devices, including display panels of mobile devices, TV, and monitors.

The invention claimed is:

1. A shift register operating in a wide screen display mode and a partial-screen display mode, for a display device comprising:
   a first shift register circuit being one stage between a first stage and a last stage in the shift register, the first shift register performing a same operation as a preceding stage in the wide screen display mode and the partial-screen display mode; and
   a second shift register circuit being another stage between the first stage and the last stage in the shift register, the second shift register performing a stop shift operation in the partial-screen display mode and performing a same operation as a preceding stage in the wide screen display mode, wherein the first shift register circuit and the second shift register circuit include same number of components.

2. The shift register of claim 1, wherein each of the first shift register circuit and the second shift register circuit includes a selecting circuit that selects a shift direction to allow shifting in two directions.

3. The shifter register of claim 1, wherein each of the first shift register circuit and the second shift register circuit includes a set-reset flip flop.

4. The shifter register of claim 1, wherein the second shift register circuit includes a shift stopping circuit.

5. The shifter register of claim 4, wherein the first shift register circuit includes a load adjusting circuit which has a same component as the shift stopping circuit.

6. The shifter register of claim 4, wherein the shift stopping circuit is a switching circuit.

7. The shifter register of claim 4, wherein the shift stopping circuit is a logic circuit.

8. A driving circuit, comprising a shift register defined in claim 1.

9. A display device, comprising the driving circuit defined in claim 8.

10. A shift register operating in a wide screen display mode and a partial-screen display mode, for a display device comprising:
   a first shift register circuit being one stage between a first stage and a last stage in the shift register, the first shift register performing a same operation as a preceding stage in the wide screen display mode and the partial-screen display mode; and
   a second shift register circuit being another stage between the first stage and the last stage in the shift register, the second shift register performing a start shift operation in the partial-screen display mode and performing a same operation as a preceding stage in the wide screen display mode, wherein the first shift register circuit and the second shift register circuit include same number of components.

11. The shifter register of claim 10, wherein the second shift register circuit includes a shift starting circuit.

12. The shifter register of claim 11, wherein the first shift register circuit includes a load adjusting circuit which has a same component as the shift starting circuit.

13. The shifter register of claim 11, wherein the shift starting circuit is a switching circuit.

14. The shifter register of claim 11, wherein the shift starting circuit is a logic circuit.

15. A driving circuit, comprising a shift register defined in claim 10.

16. A display device, comprising the driving circuit defined in claim 15.

* * * * *